United States Patent
Frougier et al.

(10) Patent No.: US 12,426,314 B2
(45) Date of Patent: Sep. 23, 2025

(54) STRAIN GENERATION AND ANCHORING IN GATE-ALL-AROUND FIELD EFFECT TRANSISTORS

(71) Applicant: INTERNATIONAL BUSINESS MACHINES CORPORATION, Armonk, NY (US)

(72) Inventors: Julien Frougier, Albany, NY (US); Sung Dae Suk, Watervliet, NY (US); Kangguo Cheng, Schenectady, NY (US); Andrew M. Greene, Slingerlands, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 773 days.

(21) Appl. No.: 17/446,479

(22) Filed: Aug. 31, 2021

(65) Prior Publication Data
US 2023/0065970 A1 Mar. 2, 2023

(51) Int. Cl.
*H10D 30/69* (2025.01)
*H10D 30/01* (2025.01)
(Continued)

(52) U.S. Cl.
CPC ......... *H10D 30/751* (2025.01); *H10D 30/024* (2025.01); *H10D 30/62* (2025.01); *H10D 62/118* (2025.01); *H10D 30/6219* (2025.01)

(58) Field of Classification Search
CPC ........... H01L 29/0665; H01L 29/66795; H01L 29/66539; H01L 29/0673; H01L 29/775; H01L 2029/7858; H10D 30/796
See application file for complete search history.

(56) References Cited

U.S. PATENT DOCUMENTS 9,196,613 B2 11/2015 Basker
9,711,414 B2 7/2017 Hatcher
(Continued)

FOREIGN PATENT DOCUMENTS

KR 20150097500 A 8/2015
TW 201739001 A 11/2017
TW 201913822 A 4/2019

OTHER PUBLICATIONS

Arimura et al., "Advantage of NW structure in preservation of SRB-induced strain and investigation of off-state leakage in strained stacked Ge NW pFET", 2018 IEEE International Electron Devices Meeting (IEDM), pp. 21.2.1-21.2.4.
(Continued)

*Primary Examiner* — Tuan A Hoang
(74) *Attorney, Agent, or Firm* — L. Jeffrey Kelly

(57) ABSTRACT

Semiconductor channel layers vertically aligned and stacked one on top of another, each separated by a gate stack material, a source-drain epitaxy region adjacent to the semiconductor channel layers, a vertical side surface of the source-drain epitaxy region is adjacent to a vertical side surface of a conductive trench contact. A first set and a second set of semiconductor channel layers, a conductive trench contact between them and a source-drain between the first set and the conductive trench contact. Forming a first stack, a second stack and a third stack of nanosheet layers, forming a first, second and third sacrificial gate, forming a first source drain between the first and second stack, forming a second source drain between the second and third, forming a vertical trench in the first source drain while protecting the second source drain, and forming a stressor material layer in the vertical trench.

20 Claims, 20 Drawing Sheets

(51) Int. Cl.
*H10D 30/62* (2025.01)
*H10D 62/10* (2025.01)

(56) References Cited

U.S. PATENT DOCUMENTS

| | | | | |
|---|---|---|---|---|
| 9,871,139 | B2 | 1/2018 | Kittl | |
| 9,871,140 | B1 | 1/2018 | Balakrishnan | |
| 9,911,834 | B2 | 3/2018 | Cheng | |
| 9,941,405 | B2 | 4/2018 | Kittl | |
| 10,431,585 | B2 | 10/2019 | Yang | |
| 10,714,569 | B1* | 7/2020 | Kong | H01L 29/785 |
| 10,957,798 | B2 | 3/2021 | Miao | |
| 2008/0251849 | A1* | 10/2008 | Yamagami | H01L 29/785 |
| | | | | 257/E29.151 |
| 2014/0001520 | A1* | 1/2014 | Glass | H10D 30/024 |
| | | | | 257/E21.409 |
| 2014/0054648 | A1* | 2/2014 | Itokawa | H10D 30/6212 |
| | | | | 257/E21.409 |
| 2015/0021709 | A1* | 1/2015 | Jacob | H10D 84/038 |
| | | | | 438/413 |
| 2016/0211371 | A1* | 7/2016 | Tsai | H10D 30/62 |
| 2018/0090570 | A1* | 3/2018 | Peng | H01L 29/66772 |
| 2019/0157411 | A1 | 5/2019 | Cappellani | |

OTHER PUBLICATIONS

Disclosed Anonymously, "Method and structure for cladded S/D formation in nanosheet transistors", An IP.com Prior Art Database Technical Disclosure, IP.com No. IPCOM000254721D, Jul. 25, 2018, 6 pages.

Disclosed Anonymously, "Method and Structure for Providing Void Free Source Drain Epitaxy for Nanosheet Devices", An IP.com Prior Art Database Technical Disclosure, IP.com No. IPCOM000259334D, Jul. 31, 2019, 6 pages.

Yoon et al., "Metal Source-/Drain-Induced Performance Boosting of Sub-7-nm Node Nanosheet FETs", IEEE Transactions on Electron Devices, vol. 66, No. 4, Apr. 2019, pp. 1868-1873.

* cited by examiner

STRAIN GENERATION AND ANCHORING IN GATE-ALL-AROUND FIELD EFFECT TRANSISTORS

BACKGROUND

The present invention relates, generally, to the field of semiconductor manufacturing, and more particularly to fabricating a gate-all-around nanosheet field effect transistor with strain.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of nanosheets extending between a pair of source/drain epitaxial regions. The device may be a gate all around transistor in which a gate surrounds at least a portion of the nanosheet channel.

Strain generation on channel layers of the nanosheet FET may be a challenge when using a bottom dielectric isolation between the source/drain epitaxial regions and a substrate.

SUMMARY

According to an embodiment, a gate-all-around device is provided. The gate-all-around device including semiconductor channel layers vertically aligned and stacked one on top of another, the semiconductor channel layers separated from each other by a gate stack material wrapping around the semiconductor channel layers, and a source-drain epitaxy region adjacent to the semiconductor channel layers, where a vertical side surface of the source-drain epitaxy region is adjacent to a vertical side surface of a conductive trench contact.

According to an embodiment, a semiconductor device is provided. The semiconductor device including a first set of semiconductor channel layers vertically aligned and stacked one on top of another, a second set of semiconductor channel layers adjacent to the first set of semiconductor channel layers, the second set of semiconductor channel layers are vertically aligned and stacked one on top of another, a conductive trench contact between the first set of semiconductor channel layers and the second set of semiconductor channel layers, and a source-drain region between the first set of semiconductor channel layers and the conductive trench contact.

According to an embodiment, a method is provided. The method including forming a first stack of nanosheet layers on a substrate, a second stack of nanosheet layers on the substrate, and a third stack of nanosheet layers on a substrate, the first stack, the second stack and the third stack of nanosheet layers each including alternating layers of a sacrificial and a semiconductor channel vertically aligned and stacked one on top of another, forming a first sacrificial gate across the first stack of nanosheet layers, a second sacrificial gate across the second stack of nanosheet layers and a third sacrificial gate across the third stack of nanosheet layers, forming a first source drain region between the first and second stack of nanosheet layers and forming a second source drain region between the second and third stack of nanosheet layers, forming a first vertical trench in the first source drain region between the first stack and the second stack of nanosheet layers while protecting the second source drain region between the second stack and the third stack of nanosheet layers from processing, and forming a first stressor material layer in the first vertical trench.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
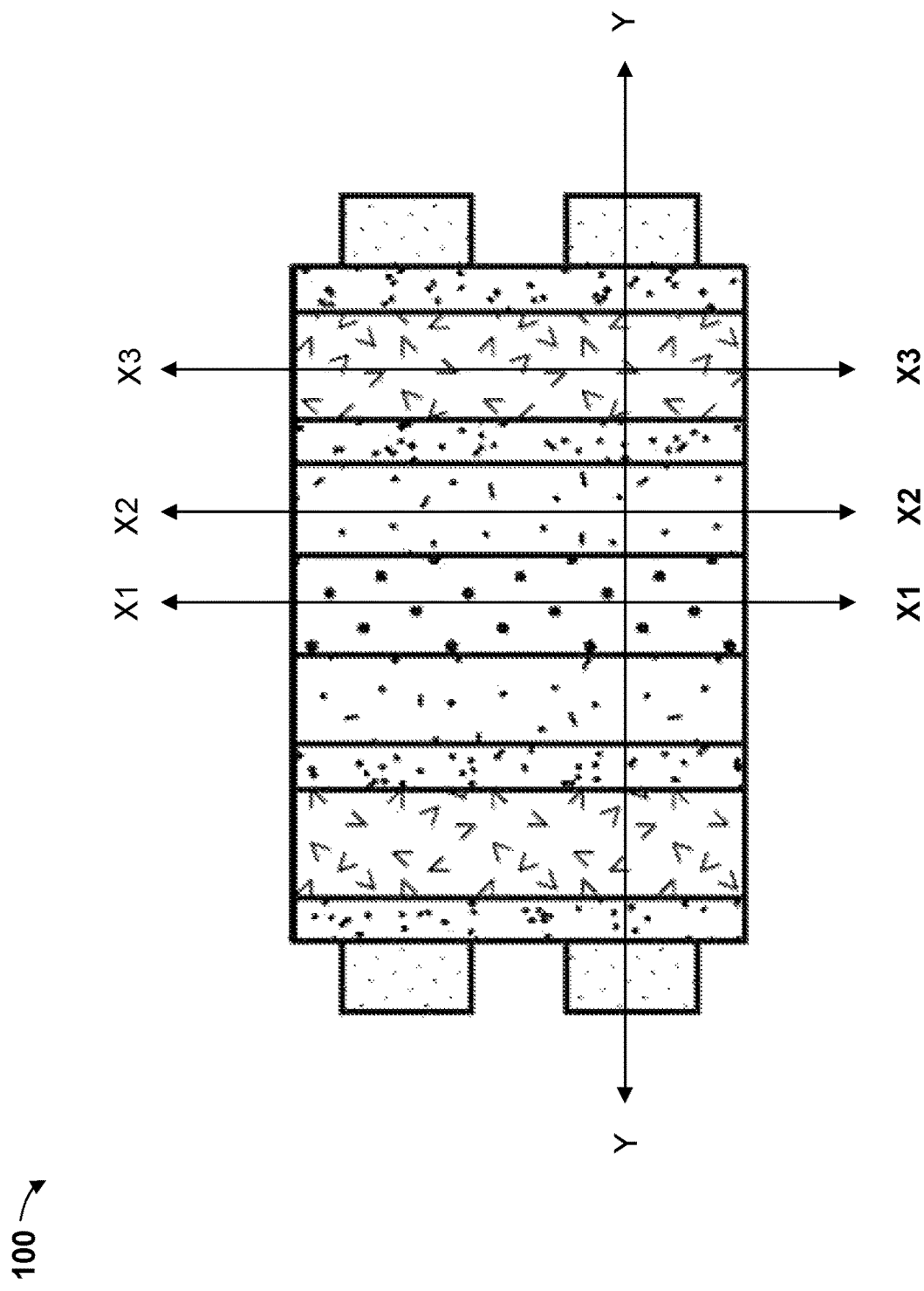
FIG. 1 illustrates a top view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon, referred to as channel layers, and silicon germanium, referred to as sacrificial suspension layers, which are then formed into nanosheets. A gate all around structure may be formed on all vertical sides and on a horizontal top surface of a section of the nanosheets. Source-drain epitaxy structures may be formed at the opposite ends of the nanosheet structures.

The present invention relates, generally, to the field of semiconductor manufacturing, and more particularly to fabricating a nanosheet field effect transistor with strain.

For nanosheet FET devices on a bulk substrate, source drain epitaxy grows from sides of the silicon channel layers of the nanosheet devices and also from the substrate. This may lead to parasitic source-to-drain leakage through the sub-sheet region under the gate region of the nanosheet FET device, which has a negative effect on nanosheet FET performance such as increased parasitic leakage.

To reduce parasitic source-to-drain leakage between the source and drain epitaxy contact through the substrate, a bottom dielectric isolation (BDI) which isolates the source-drain epitaxy from the substrate is required for optimal electrical performances, especially at effective gate stack lengths of 12 nm and below. The effective gate stack length is defined as the physical distance of the gate stack in the direction of current transport (not accounting for the thickness of the gate dielectric). For example, a gate length of 15 nm may have an effective gate length of 12 nm.

Typically, stress can be generated in the source drain epitaxy by having a bottom-up nucleation and growth component from the substrate. However, the addition of a BDI layer may remove this bottom-up nucleation and growth component leading to a fully relaxed source-drain epitaxy, thereby reducing device performance. Here, the inventors propose a new method of introducing stress to the source drain epitaxy.

In the case of p-type FETs (p-FETs), even without the BDI, the presence of inner spacers surrounding sacrificial layers of the nanosheet make it very challenging to generate compressive strain on the channel because the inner spacer create a stacking fault in the source-drain epitaxy during the nucleation, growth and merge of the epitaxy. Similarly, in the case of n-type FETs (n-FETs), the presence of inner spacers surrounding sacrificial layers of the nanosheet make it very challenging to generate tensile strain on the channel.

A nanosheet may be formed on a substrate with a stack sacrificial layer covered with and alternating layers of semiconductor channel material and sacrificial layers. Vertical trenches may be made across the nanosheets, separating the nanosheet into nanosheet stacks, and a shallow trench isolation region formed between the nanosheet stacks. A sacrificial gate may be formed over the nanosheet stack. The stack sacrificial layer may be removed and a bottom dielectric isolation (BDI) may replace the stack sacrificial layer. Gate spacers may be formed. Vertical portions of the nanosheet stacks may be removed between adjacent sacrificial gates. Exposed portions of the sacrificial layers may be removed and inner spacers may replace the removed portions of the sacrificial layers. A source drain region may be epitaxially grown between the nanosheet stacks. A sacrificial spacer may be formed surrounding the sacrificial gates.

As proposed herein, a vertical portion of the source drain region may be recessed between the sacrificial gates, and subsequently filled with a stressor material layer. The chosen stressor material layer provides the desired strain in the channel, whether compressive for p-FET or tensile for n-FET, through the source drain region to the semiconductor channel layers of the nanosheet stack.

Stress on the semiconductor channel layer improves performance of the nanosheet FET by generating strain in the channel, improving carrier mobility in the channel and thereby increasing device performance. Strain engineering allows local modification of the band structure in the channel region, affecting the effective mass of the carriers and hence the carrier mobility during transport in the channel region.

Embodiments of the present invention disclose a structure and a method of forming a gate-all-around nanosheet with strain are described in detail below by referring to the accompanying drawings, in accordance with an illustrative embodiment.

Referring now to FIG. 1, a semiconductor structure 100 (hereinafter "structure") at an intermediate stage of fabrication is shown according to an exemplary embodiment. FIG. 1 is a top view of the structure 100 at an intermediate stage of fabrication. The structure 100 of FIG. 1 may be formed or provided.

Section line Y-Y of FIG. 1 is an intersecting line along a length of fins or nanosheet stacks of the structure 100. Section X1-X1, Section X2-X2 and Section X3-X3 are parallel to each other, are each perpendicular to the length of the fins and are each perpendicular to Section line Y-Y. Section line X1-X1 is an intersection line parallel to the gates and centered between adjacent gates in a contact region. Section line X2-X2 is an intersection line parallel to the gates and between Section line X1-X1 and Section line X3-X3 in the source-drain epitaxy region. Section X3-X3 is an intersection line along a length of gates centered along the length of the gates.

Figure 2:
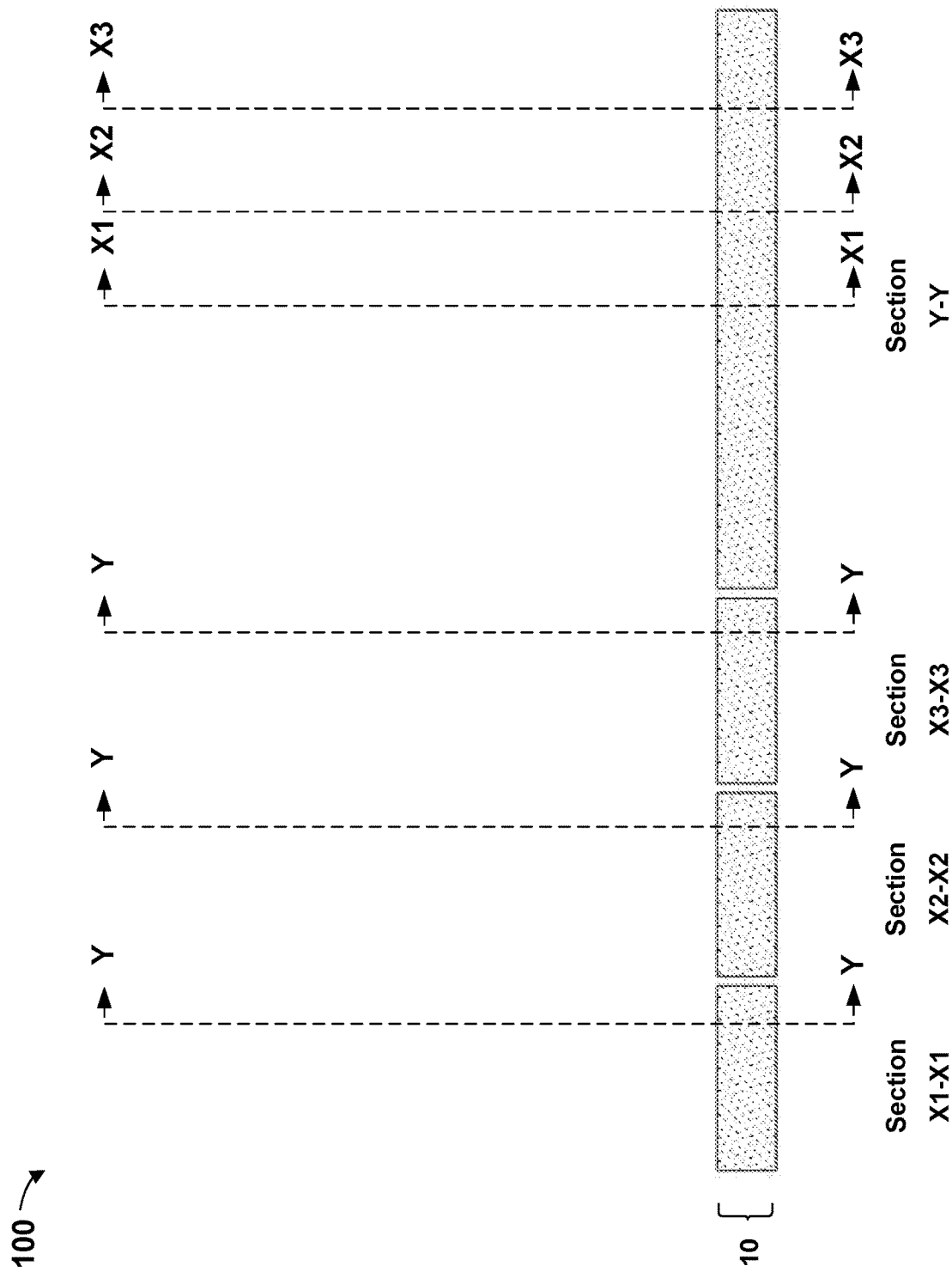
FIG. 2 Section X1-X1, FIG. 2 Section X2-X2, FIG. 2 Section X3-X3 and FIG. 2 section Y-Y, each illustrate a cross-sectional view of the semiconductor structure of FIG. 1 along sections X1-X1, X2-X2, X3-X3 and Y-Y, respectively, according to an exemplary embodiment.

Referring now FIG. 2 Sections X1-X1, X2-X2, X3-X3 and Y-Y, the structure 100 is shown according to an exemplary embodiment. FIG. 2 Sections X1-X1, X2-X2 and X3-X3 are each a cross-sectional view of the structure 100 along section lines X1-X1, X2-X2 and X3-X3, respectively and are parallel to each other. FIG. 2 Section Y-Y is a cross-sectional view of the structure 100 along section line Y-Y and is perpendicular to section lines X1-X1, X2-X2 and X3-X3. The structure 100 of FIGS. 1 and 2 may be formed or provided.

The structure 100 may include a substrate 10. The substrate 10 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 10 may be approximately, but is not limited to, several hundred microns thick. In other embodiments, the substrate 10 may be a layered semiconductor such as a silicon-on-insulator or SiGe-on-insulator, where a buried insulator layer, separates a base substrate from a top semiconductor layer.

Figure 3:
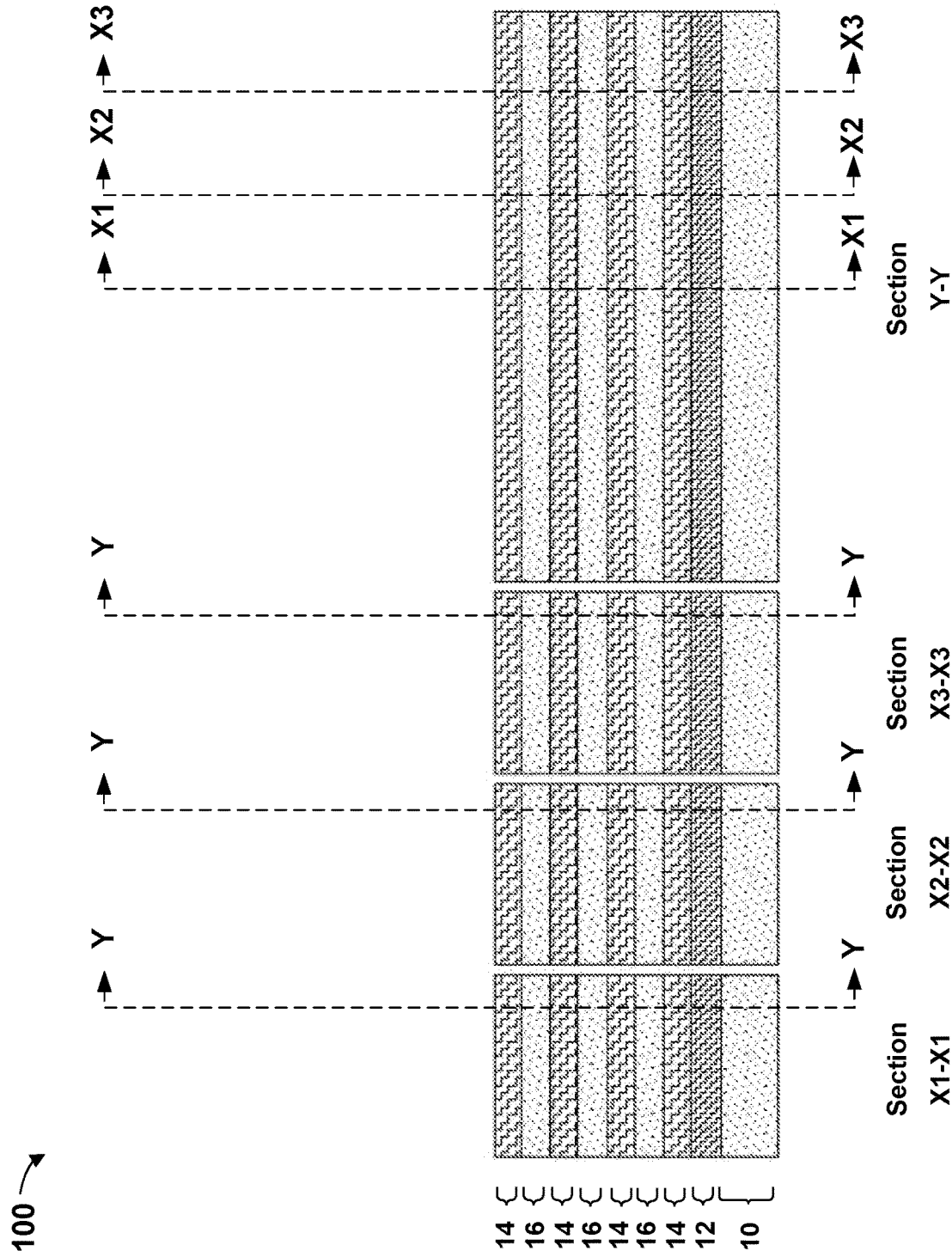
FIG. 3 Section X1-X1, FIG. 3 Section X2-X2, FIG. 3 Section X3-X3 and FIG. 3 section Y-Y, each illustrate a cross-sectional view of the semiconductor structure along sections X1-X1, X2-X2, X3-X3 and Y-Y, respectively, and illustrates formation of semiconductor material layers, according to an exemplary embodiment.

Referring now to FIG. 3 Sections X1-X1, X2-X2, X3-X3 and Y-Y, the structure 100 is shown according to an exemplary embodiment. FIG. 3 Sections X1-X1, X2-X2 and X3-X3 are each a cross-sectional view of the structure 100 along section lines X1-X1, X2-X2 and X3-X3, respectively and are parallel to each other. FIG. 3 Section Y-Y is a cross-sectional view of the structure 100 along section line Y-Y and is perpendicular to section lines X1-X1, X2-X2 and X3-X3.

As shown in FIG. 3 Sections X1-X1, X2-X2, X3-X3 and Y-Y, a nanosheet stack of alternating layers of sacrificial semiconductor material and semiconductor channel material stacked one on top of another, may be formed on the substrate 10. It should be noted that, while a limited number of alternating layers are depicted, any number of alternating layers may be formed.

The alternating layers of sacrificial semiconductor material and semiconductor channel material may include a nanosheet stack sacrificial layer 12 (hereinafter "stack sacrificial layer") on the substrate 10, covered by a sacrificial suspension semiconductor material layer 14 (hereinafter "sacrificial suspension layer"), covered by a semiconductor channel material layer 16 (hereinafter "channel layer"), covered by a sacrificial suspension layer 14, covered by a channel layer 16, covered by a sacrificial suspension layer 14, covered by a channel layer 16, covered by a sacrificial suspension layer 14.

The stack sacrificial layer 12, may, for example, be silicon germanium with a germanium concentration between 45 and 70 atomic percent, although percentages greater than 70 percent and less than 45 percent may be used. The stack sacrificial layer 12 can be formed using known deposition techniques or an epitaxial growth technique as described below. The stack sacrificial layer 12 will subsequently be removed selective to the remaining alternating layers, as described below.

Each sacrificial suspension layer 14 is composed of a first semiconductor material which differs in composition from at least an upper portion of the substrate 10, the channel layers 16 and the stack sacrificial layer 12. In an embodiment, each sacrificial suspension layer 14 may be a silicon-germanium semiconductor alloy and have a germanium concentration less than 50 atomic percent. In another example, each sacrificial suspension layer 14 may have a germanium concentration ranging from about 15 atomic percent to about 35 atomic percent, although percentages greater than 35 percent and less than 15 percent may be used. Each sacrificial suspension layer 14 can be formed using known deposition techniques or an epitaxial growth technique as described below.

Each channel layer 16 is composed of a second semiconductor material which differs in composition from at least the upper portion of the substrate 10, the sacrificial suspension layers 14 and the stack sacrificial layer 12. Each channel layer 16 has a different etch rate than the first semiconductor material of sacrificial suspension layer 14 and has a different etch rate than the stack sacrificial layer 12. The sacrificial suspension layer 14 has a different etch rate than the stack sacrificial layer 12. The second semiconductor material can be, for example, silicon. The second semiconductor material, for each channel layer 16, can be formed using known deposition techniques or an epitaxial growth technique as described above.

The stack sacrificial layer 12 and the alternating layers of sacrificial suspension layers 14 and the channel layers 16 can be formed by sequential epitaxial growth of the stack sacrificial layer material and alternating layers of the first semiconductor material and the second semiconductor material.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth of first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

The stack sacrificial layer 12 may have a thickness ranging from about 5 nm to about 15 nm. The sacrificial suspension layers 14 may each have a thickness ranging from about 5 nm to about 12 nm, while the channel layers 16 may each have a thickness ranging from about 5 nm to about 12 nm. Each sacrificial suspension layer 14 may have a thickness that is the same as, or different from, a thickness of each channel layer 16. In an embodiment, each sacrificial suspension layer 14 has an identical thickness. In an embodiment, each channel layer 16 has an identical thickness.

Figure 4:
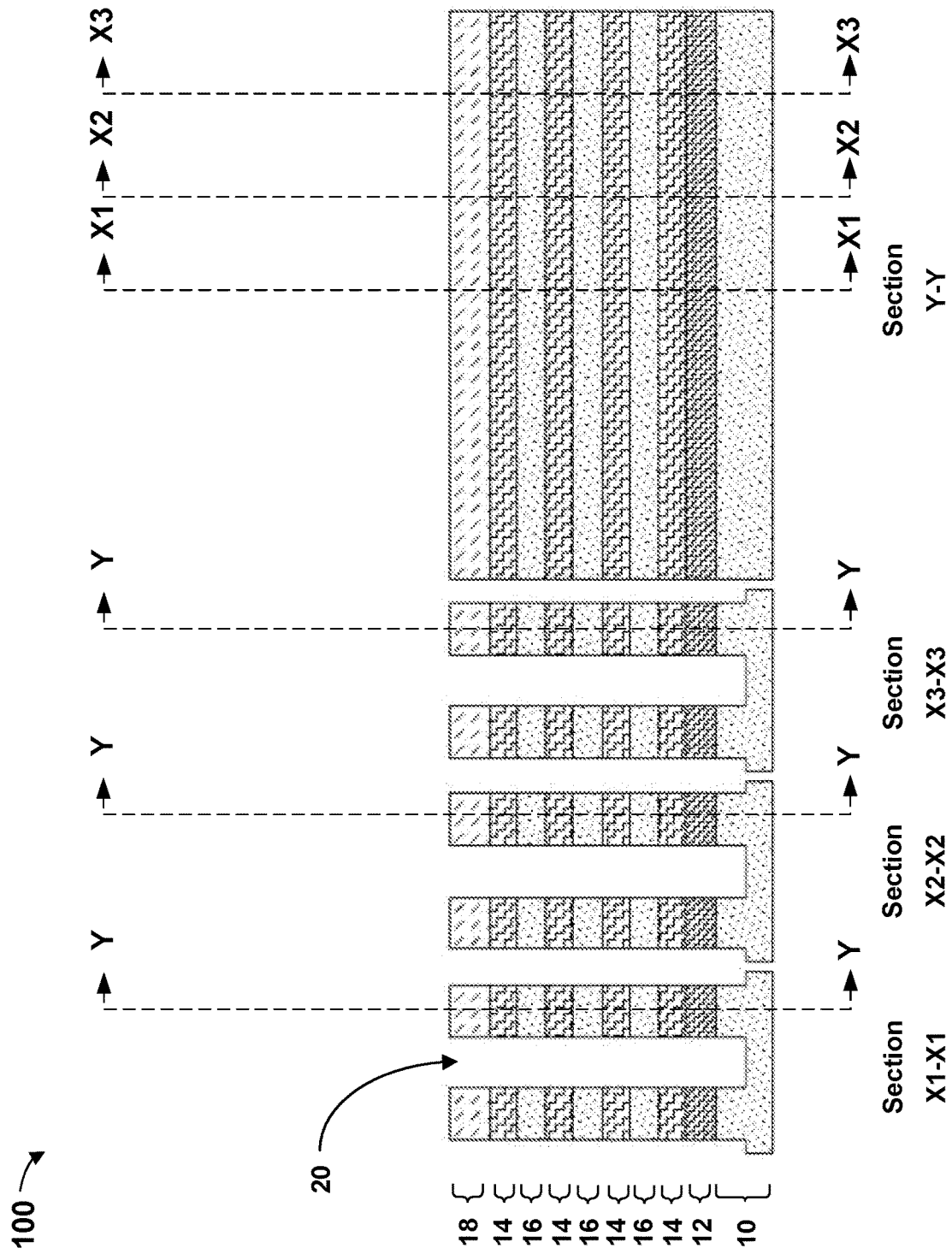
FIG. 4 Section X1-X1, FIG. 4 Section X2-X2, FIG. 4 Section X3-X3 and FIG. 4 section Y-Y, each illustrate a cross-sectional view of the semiconductor structure along sections X1-X1, X2-X2, X3-X3 and Y-Y, respectively, and illustrates formation of nanosheet stacks, according to an exemplary embodiment.

Referring now to FIG. 4 Sections X1-X1, X2-X2, X3-X3 and Y-Y, the structure 100 is shown according to an exemplary embodiment. FIG. 4 Sections X1-X1, X2-X2 and X3-X3 are each a cross-sectional view of the structure 100 along section lines X1-X1, X2-X2 and X3-X3, respectively and are parallel to each other. FIG. 4 Section Y-Y is a cross-sectional view of the structure 100 along section line Y-Y and is perpendicular to section lines X1-X1, X2-X2 and X3-X3.

As shown in FIG. 4 Sections X1-X1, X2-X2 and X3-X3, the nanosheet stack may be formed into nanosheet stacks. The nanosheet stacks may have a length perpendicular to Sections X1-X1, X2-X2, X3-X3, and parallel to Section Y-Y.

A hard mask 18 may be formed over an upper horizontal surface of the stack sacrificial layer 12 and the alternating layers of sacrificial suspension layers 14 and channel layers 16, by methods known in the art. The hard mask 18 may cover the uppermost sacrificial suspension layer 14.

The stack sacrificial layer 12, the alternating layers of sacrificial suspension layers 14 and channel layers 16 and the hard mask 18 may be formed into nanosheet stacks, each covered with the hard mask 18, by patterning the hard mask 18 and subsequent formation of one or more vertical trenches 20, by removal of portions of each layer. The vertical trench 20 may be formed between each nanosheet stack by an anisotropic etching technique, such as, for example, reactive ion etching (RIE), and stopping on etching a portion of the substrate 10 for subsequent formation of a shallow trench isolation region (hereinafter "STI") between each nanosheet stack.

Each nanosheet stack may include the stack sacrificial layer 12 covered by the alternating layers of sacrificial suspension layers 14 and channel layers 16, covered by the hard mask 18. In this embodiment, and only by way of an example, the nanosheet stack includes four layers of sacrificial suspension layers 14 alternating with three layers of the channel layers 16. The material stacks that can be employed in embodiments of the present invention are not limited to the specific embodiment illustrated in the Figures. There may be any number of nanosheet stacks on the structure 100.

The nanosheet stack is used to produce a gate all around device that includes vertically stacked semiconductor channel material nanosheets for a p-FET or an n-FET device.

Figure 5:
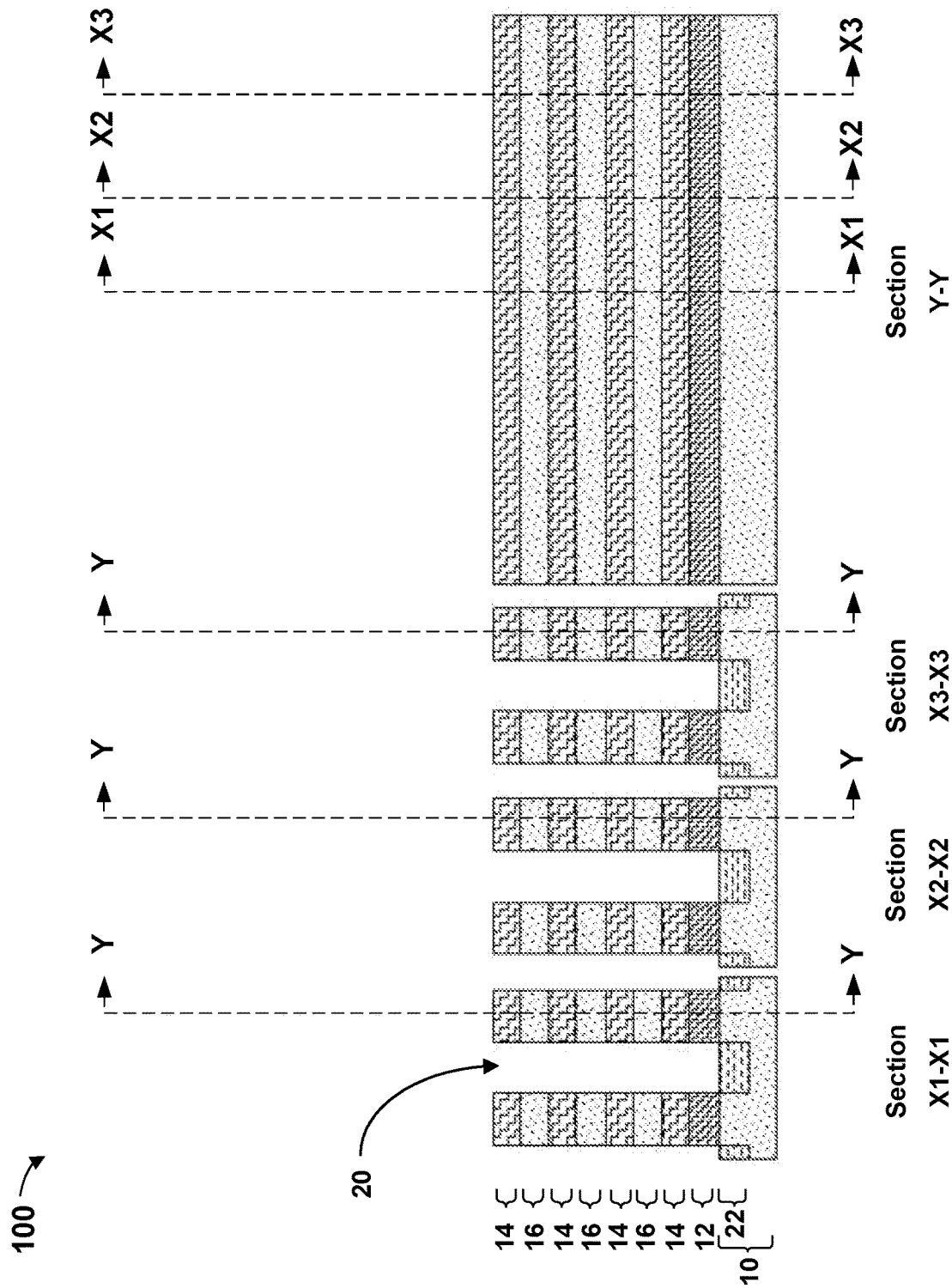
FIG. 5 Section X1-X1, FIG. 5 Section X2-X2, FIG. 5 Section X3-X3 and FIG. 5 section Y-Y, each illustrate a cross-sectional view of the semiconductor structure along sections X1-X1, X2-X2, X3-X3 and Y-Y, respectively, and illustrates formation of a shallow trench isolation region, according to an exemplary embodiment.

Referring now to FIG. 5 Sections X1-X1, X2-X2, X3-X3 and Y-Y, the structure 100 is shown according to an exemplary embodiment. FIG. 5 Sections X1-X1, X2-X2 and X3-X3 are each a cross-sectional view of the structure 100 along section lines X1-X1, X2-X2 and X3-X3, respectively and are parallel to each other. FIG. 5 Section Y-Y is a cross-sectional view of the structure 100 along section line Y-Y and is perpendicular to section lines X1-X1, X2-X2 and X3-X3.

As shown in FIG. 5 Sections X1-X1, X2-X2 and X3-X3, a shallow trench isolation, (hereinafter "STI"), 22 is formed in a portion of the vertical trench 20. The STI 22 may be formed between adjacent nanosheet stacks in the portion of the vertical trench 20, between adjacent nanosheet stacks. The STI 22 may be a dielectric material and may be between adjacent nanosheet stacks and formed using known deposition, planarization and etching techniques. Adjacent nanosheet stacks are isolated from one another in the substrate 10 by the STI 22. A lower horizontal surface and a portion of a vertical side surface of the STI 22 may be adjacent to a lower horizontal surface and a vertical side surface of the substrate 10. The lower horizontal surface of the STI 22 may be below a lower horizontal surface of the stack sacrificial layer 12.

Figure 6:
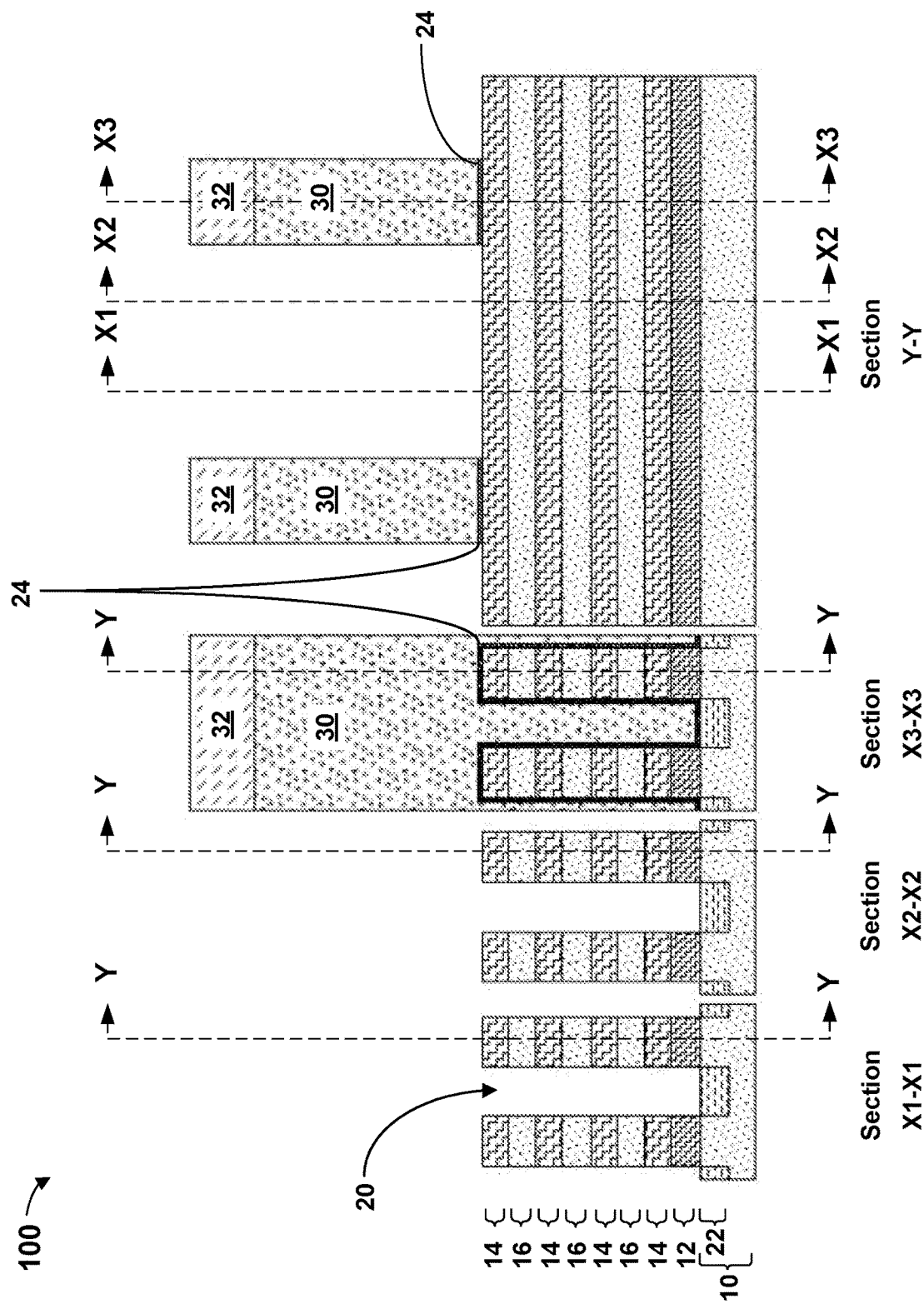
FIG. 6 Section X1-X1, FIG. 6 Section X2-X2, FIG. 6 Section X3-X3 and FIG. 6 section Y-Y, each illustrate a cross-sectional view of the semiconductor structure along sections X1-X1, X2-X2 and Y-Y, respectively, and illustrates formation of a sacrificial gate, according to an exemplary embodiment.

Referring now to FIG. 6 Sections X1-X1, X2-X2, X3-X3 and Y-Y, the structure 100 is shown according to an exemplary embodiment. FIG. 6 Sections X1-X1, X2-X2 and X3-X3 are each a cross-sectional view of the structure 100 along section lines X1-X1, X2-X2 and X3-X3, respectively and are parallel to each other. FIG. 6 Section Y-Y is a cross-sectional view of the structure 100 along section line Y-Y and is perpendicular to section lines X1-X1, X2-X2 and X3-X3.

As shown in FIG. 6 Sections X3-X3 and Y-Y, a gate sacrificial dielectric 24, a sacrificial gate 30 and a gate hardmask 32 may be formed.

The sacrificial gate 30 may include a single sacrificial material or a stack of one or more sacrificial materials. The at least one sacrificial material can be formed by forming a blanket layer (or layers) of a material (or various materials) and then patterning the material (or various materials) by lithography and an etch. The sacrificial gate 30 can include any material including, for example, polysilicon, amorphous silicon, or multilayered combinations thereof. The sacrificial gate 30 can be formed using any deposition technique including, for example, chemical vapor deposition (CVD), physical vapor deposition (PVD), high density plasma (HDP) deposition, and spin on techniques. Optionally, the gate sacrificial dielectric 24 and the gate hardmask 32 may be formed as part of the sacrificial gate 30 in accordance with known techniques. As shown in FIG. 6 Section Y-Y, there are two sacrificial gates 30. In an embodiment, there may be any number of sacrificial gates 30 formed.

In an embodiment, the sacrificial gate 30 is deposited with a thickness sufficient to fill, or substantially fill, the spaces between adjacent nanosheet structures as shown in FIG. 6 Section X3-X3 and cover an upper surface and exposed side surfaces of an upper surface of the uppermost sacrificial suspension layer 14 of the nanosheet stack. The sacrificial gate 30 may be adjacent to vertical side surfaces of the nanosheet stack, including vertical side surfaces of the stack sacrificial layer 12, the channel layers 16 and the stack sacrificial suspension layers 14. A height of the sacrificial gate 30 may be much thicker than the underlying structure and may have a height between 50 nm and 100 nm above the nanosheet stack.

In an embodiment, the gate sacrificial dielectric 24 may be conformally formed before formation of the sacrificial gate 30, and the sacrificial gate 30 formed on the gate sacrificial dielectric 24. The gate sacrificial dielectric 24 may cover an upper surface and exposed side surfaces of the uppermost sacrificial suspension layer 14 of the nanosheet stack. The gate sacrificial dielectric 24 may be adjacent to vertical side surfaces of the nanosheet stack, including vertical side surfaces of the stack sacrificial layer 12, the channel layers 16 and the stack sacrificial suspension layers 14. The gate sacrificial dielectric 24 may cover an upper horizontal surface of the STI 22 between nanosheet stacks. The gate sacrificial dielectric 24 may be about 3 nm thick.

The gate hardmask 32 may be formed over a horizontal upper surface of the sacrificial gate 30, by methods known in the art. The gate hardmask 32 may have vertical side surfaces which align with vertical side surfaces of the sacrificial gate 30.

Figure 7:
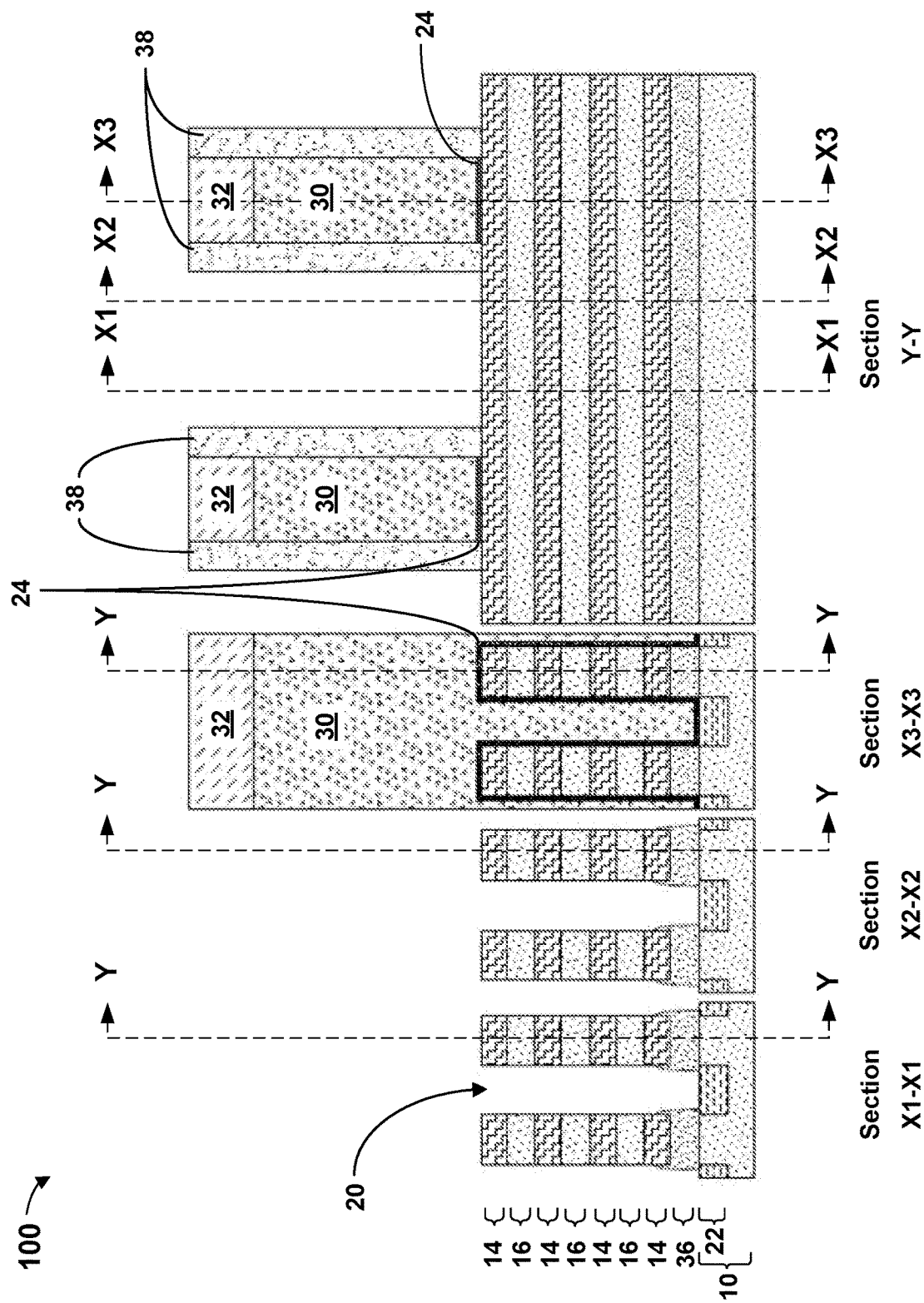
FIG. 7 Section X1-X1, FIG. 7 Section X2-X2, FIG. 7 Section X3-X3 and FIG. 7 section Y-Y, each illustrate a cross-sectional view of the semiconductor structure along sections X1-X1, X2-X2, X3-X3 and Y-Y, respectively, and illustrates formation of a bottom dielectric isolation and a gate spacer, according to an exemplary embodiment.

Referring now to FIG. 7 Sections X1-X1, X2-X2, X3-X3 and Y-Y, the structure 100 is shown according to an exemplary embodiment. FIG. 7 Sections X1-X1, X2-X2 and X3-X3 are each a cross-sectional view of the structure 100 along section lines X1-X1, X2-X2 and X3-X3, respectively and are parallel to each other. FIG. 7 Section Y-Y is a cross-sectional view of the structure 100 along section line Y-Y and is perpendicular to section lines X1-X1, X2-X2 and X3-X3.

As shown in FIG. 7 Sections X1-X1, X2-X2, X3-X3 and Y-Y, the stack sacrificial layer 12 may be removed, a bottom dielectric isolation 36 may be formed and a gate spacer 38 may be formed.

The stack sacrificial layer 12 may be removed selective to the sacrificial suspension layers 14, the channel layers 16, the STI 22, the sacrificial gate 30, the gate sacrificial dielectric 24 and the gate hardmask 32. For example, a dry etching technique can be used to selectively remove the stack sacrificial layer 12, such as, for example, using vapor phase HCl dry etch.

The bottom dielectric isolation 36 and the gate spacer 38 may be formed. The bottom dielectric isolation 36 may be formed in an opening, not shown, where the stack sacrificial layer 12 has been removed. The bottom dielectric isolation 36 may be formed between a bottom most sacrificial suspension layer 14 of the nanosheet stack and the substrate 10. Vertical side surfaces of the bottom dielectric isolation 36 may be slightly wider than vertical side surfaces of the nanosheet stack, tapering wider near a surface of the substrate 10, and may cover a portion of a vertical side surface of the nanosheet stack. The gate side spacer 38 may be formed on either side of the sacrificial gate 30 and the gate hardmask 32.

The bottom dielectric isolation 36 and the gate spacer 38 may each be formed after several processes, including for example, conformally depositing or growing a dielectric and performing an anisotropic etch process. The bottom dielectric isolation 36 and the gate side spacer 38 may include any dielectric material such as silicon nitride and may include a single layer or may include multiple layers of dielectric material. In an embodiment, the bottom dielectric isolation 36 and the gate spacer 38 may be the same material. The bottom dielectric isolation 36 and the gate spacer 38 may be formed simultaneously or may be formed separately.

Figure 8:
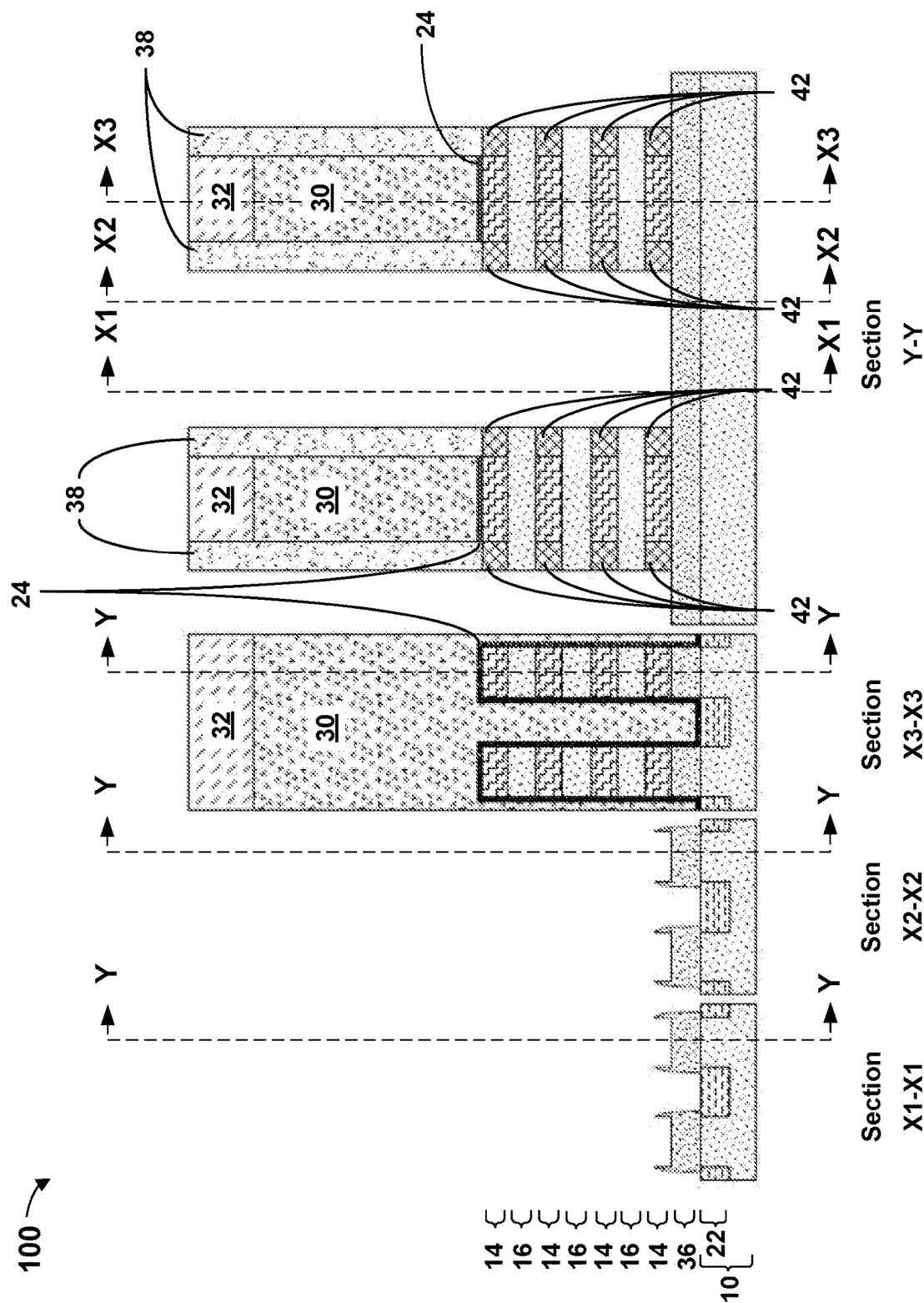
FIG. 8 Section X1-X1, FIG. 8 Section X2-X2, FIG. 8 Section X3-X3 and FIG. 8 section Y-Y, each illustrate a cross-sectional view of the semiconductor structure along sections X1-X1, X2-X2, X3-X3 and Y-Y, respectively, and illustrates formation of source drain cavities and inner spacers, according to an exemplary embodiment.

Referring now to FIG. 8 Sections X1-X1, X2-X2, X3-X3 and Y-Y, the structure 100 is shown according to an exemplary embodiment. FIG. 8 Sections X1-X1, X2-X2 and X3-X3 are each a cross-sectional view of the structure 100 along section lines X1-X1, X2-X2 and X3-X3, respectively and are parallel to each other. FIG. 8 Section Y-Y is a cross-sectional view of the structure 100 along section line Y-Y and is perpendicular to section lines X1-X1, X2-X2 and X3-X3.

As shown in FIG. 8 Sections X1-X1, X2-X2 and Y-Y, a vertical portion of the nanosheet stack may be recessed, a portion of each of the sacrificial suspension layers 14 may be indented, and an inner spacer 42 may be formed on either side of the sacrificial suspension layers 14.

The vertical portion of the nanosheet stack which is recessed may be between two adjacent sacrificial gates 30, gate hardmask 32 and the gate spacers 38 surrounding each sacrificial gate 30. The vertical portion of the nanosheet stack which is recessed may include removing a vertical portion of the nanosheet stack, including removal of aligned vertical portions of each of the channel layers 16 and each of the sacrificial suspension layers 14. The sacrificial gate 30, gate hardmask 32 and the gate spacers 38 may protect remaining portions of the nanosheet stack. The vertical portion of the nanosheet stack may be recessed via etching using an anisotropic etching technique, such as, for example, reactive ion etching (RIE), and stopping at the bottom dielectric isolation 36. There may be any number of vertical portions removed in the structure 100, between sacrificial gates 30. The vertical portion of the nanosheet stack may be recessed to form source drain cavities for subsequent formation of a source drain epitaxy.

A portion of each of the sacrificial suspension layers 14 on either side of where the vertical portion of the nanosheet stack was recessed, may be indented. The portion of each of the sacrificial suspension layers 14 may be indented selective to the sacrificial gate 30, the gate hardmask 32, the gate spacer 38, the channel layers 16, the bottom dielectric isolation 36 and the STI 22.

The inner spacer 42 may be formed on either side of the sacrificial suspension layers 14. Outer vertical sides of the inner spacer 42 may vertically align with the channel layers 16 and inner vertical sides of the inner spacer may vertically align with remaining portions of the sacrificial suspension layers 14.

The inner spacer 42 may each be formed after several processes, including for example, conformally depositing or growing a dielectric and performing an isotropic etch process. The inner spacer 42 may include any dielectric material such as silicon nitride and may include a single layer or may include multiple layers of dielectric material.

Figure 9:
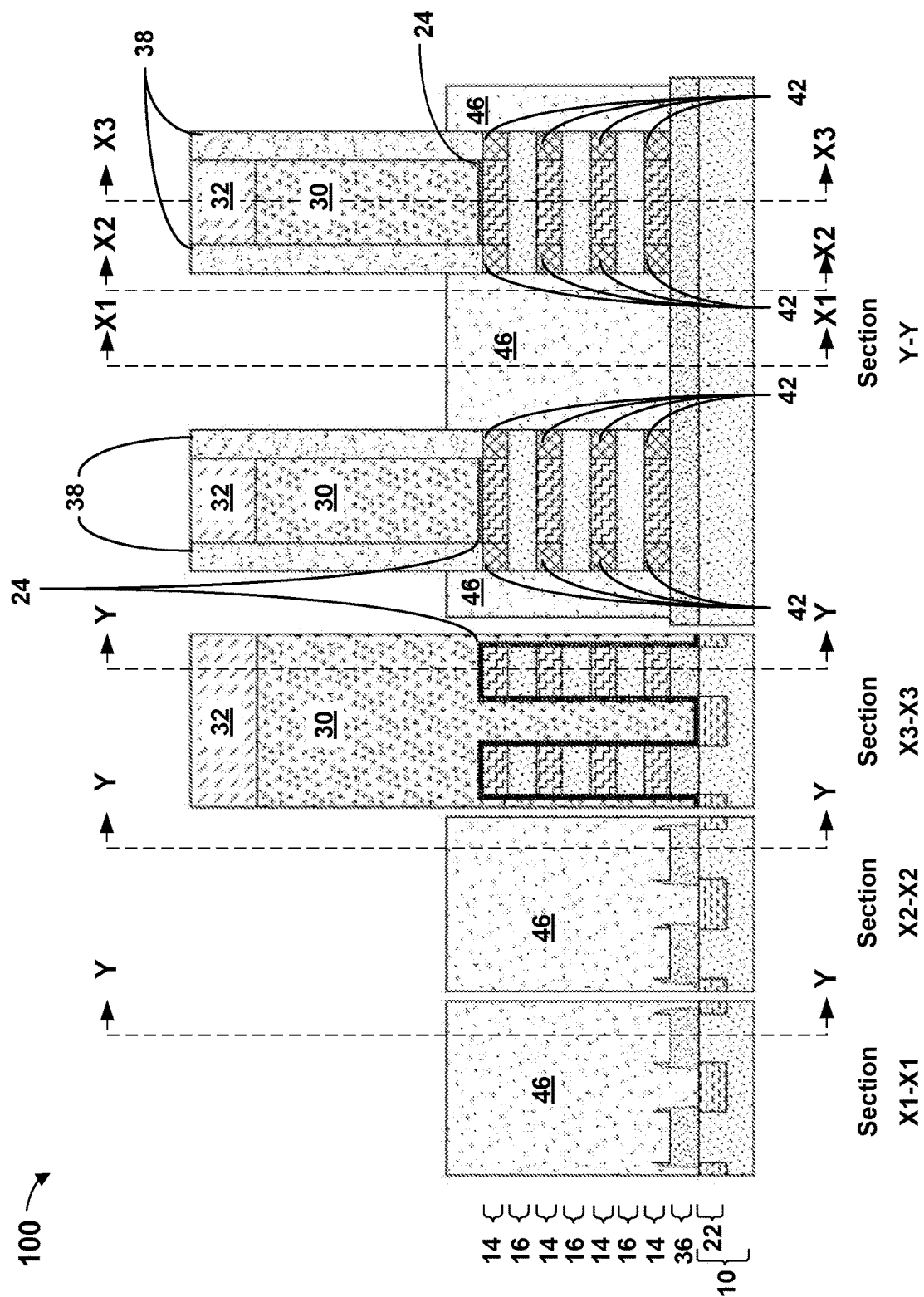
FIG. 9 Section X1-X1, FIG. 9 Section X2-X2, FIG. 9 Section X3-X3 and FIG. 9 section Y-Y, each illustrate a cross-sectional view of the semiconductor structure along sections X1-X1, X2-X2, X3-X3 and Y-Y, respectively, and illustrates formation of a source drain epitaxy, according to an exemplary embodiment.

Referring now to FIG. 9 Sections X1-X1, X2-X2, X3-X3 and Y-Y, the structure 100 is shown according to an exemplary embodiment. FIG. 9 Sections X1-X1, X2-X2 and X3-X3 are each a cross-sectional view of the structure 100 along section lines X1-X1, X2-X2 and X3-X3, respectively and are parallel to each other. FIG. 9 Section Y-Y is a cross-sectional view of the structure 100 along section line Y-Y and is perpendicular to section lines X1-X1, X2-X2 and X3-X3.

As shown in FIG. 9 Sections X1-X1, X2-X2 and Y-Y, a source drain epitaxy 46 may be formed.

The source drain epitaxy 46 may be formed where the vertical portion of each nanosheet stack was removed, and may be partially recessed using methods known in the art.

The source drain epitaxy 46 may be epitaxially grown, as described above, in a region between adjacent sacrificial gates 30, gate hardmask 32 and gate spacers 38, where the vertical portion of the nanosheet stack was recessed. The source drain epitaxy 46 may be in direct contact with end portions of the channel layers 16 of the nanosheet stack and end portions of the inner spacer 42 surrounding the sacrificial suspension layers 14. The source drain epitaxy 46 may be formed over the bottom dielectric isolation 36. An upper surface of the source drain epitaxy 46 may be above the nanosheet stack between adjacent sacrificial gates 30, gate hardmask 32 and gate spacers 38.

Figure 10:
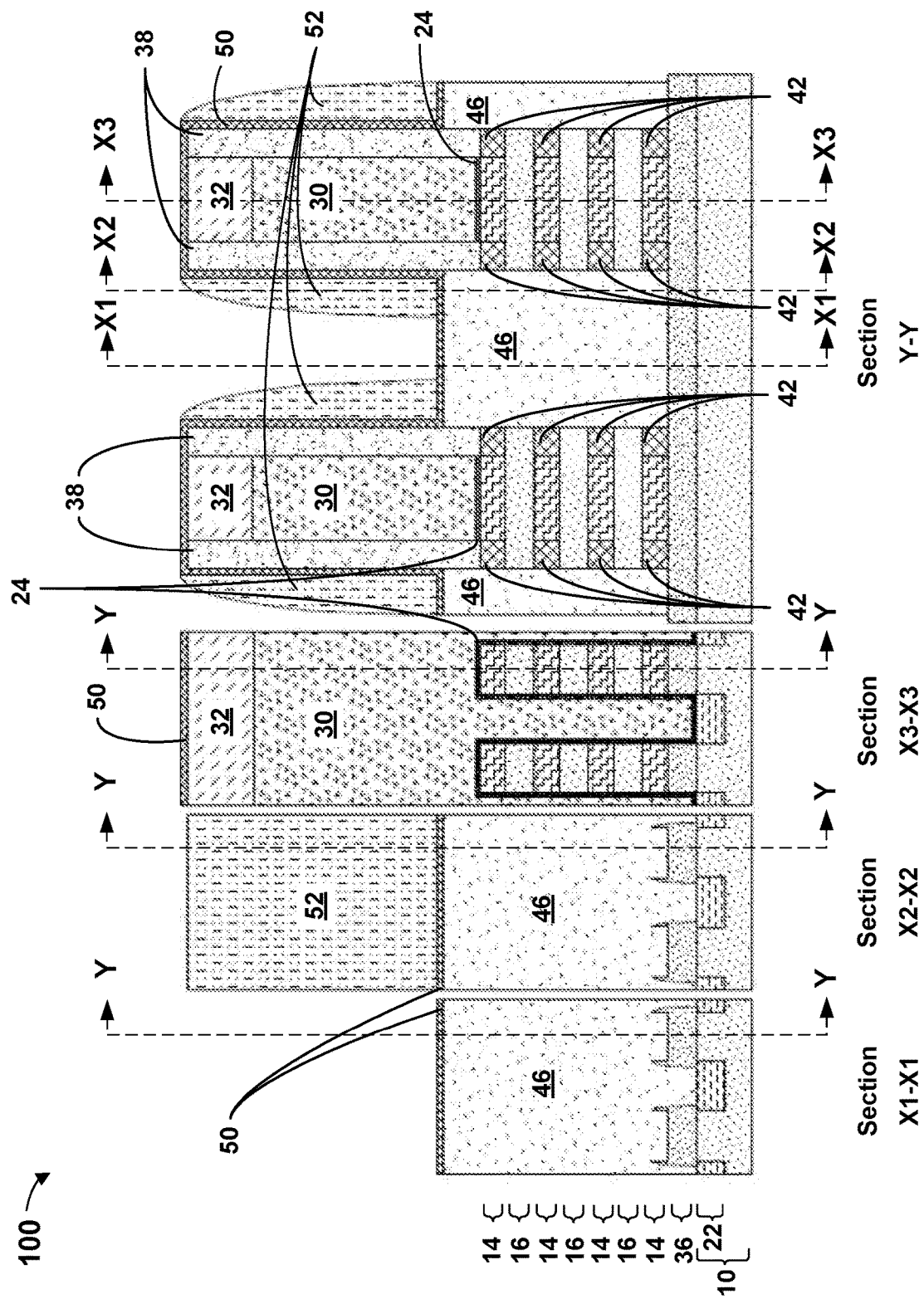
FIG. 10 Section X1-X1, FIG. 10 Section X2-X2, FIG. 10 Section X3-X3 and FIG. 10 section Y-Y, each illustrate a cross-sectional view of the semiconductor structure along sections X1-X1, X2-X2, X3-X3 and Y-Y, respectively, and illustrates formation of an etch stop liner and a sacrificial spacer, according to an exemplary embodiment.

Referring now to FIG. 10 Sections X1-X1, X2-X2, X3-X3 and Y-Y, the structure 100 is shown according to an exemplary embodiment. FIG. 10 Sections X1-X1, X2-X2 and X3-X3 are each a cross-sectional view of the structure 100 along section lines X1-X1, X2-X2 and X3-X3, respectively and are parallel to each other. FIG. 10 Section Y-Y is a cross-sectional view of the structure 100 along section line Y-Y and is perpendicular to section lines X1-X1, X2-X2 and X3-X3.

As shown in FIG. 10 Sections X1-X1, X2-X2, X3-X3 and Y-Y, an etch stop liner 50 and a sacrificial spacer 52 may be formed.

The etch stop liner 50 may be conformally formed on the structure 100. The etch stop liner 50 may cover an upper surface of the source drain epitaxy 46, an upper surface and outer side surface of the gate spacer 38 and an upper surface of the gate hardmask 32. The etch stop liner 50 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the etch stop liner 50 may include one or more layers. The etch stop liner 50 may include materials such as a nitride. The etch stop liner 50 may be referred to as a contact etch stop layer (CESL) 50. The etch stop liner 50 may be 4 nm thick.

The sacrificial spacer 52 may be conformally formed on the structure 100 and may be selectively removed by an anisotropic etching technique, such as, for example, reactive ion etching (RIE), such that remaining portions of the sacrificial spacer 52 form a sidewall spacer surrounding vertical side surfaces of the etch stop liner 50 surrounding the sacrificial gate 30, the gate hardmask 32 and the gate spacer 38. The sacrificial spacer 52 may be an oxide, such as a silicon oxide, $SiO_2$, SiOC, SiOCN, or a low-k material which may be selectively etched, selective to the material of other components on the structure 100. An exposed upper surface of the etch stop liner 50 may remain above the sacrificial gate 30, the gate hardmask 32 and the gate spacer 38. An exposed upper surface of the etch stop liner 50 may remain above the source drain epitaxy 46 between adjacent sacrificial gates 30.

The sacrificial spacer 52 is instrumental in subsequent steps to create a self-aligned vertical trench in the source drain epitaxy 46 which may be used for introduction of stressor material in the vertical trench in the source drain epitaxy 46.

Figure 11:
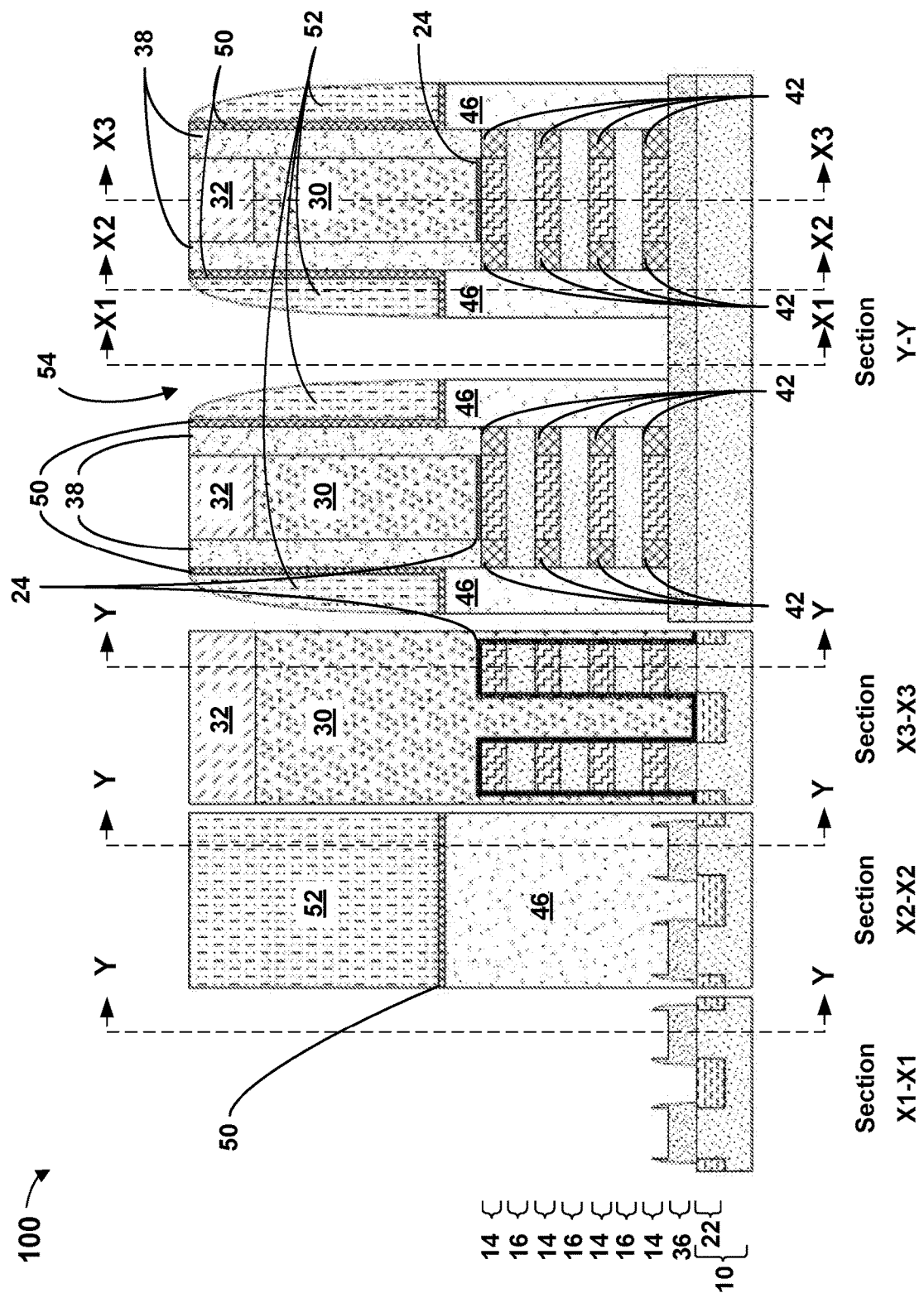
FIG. 11 Section X1-X1, FIG. 11 Section X2-X2, FIG. 11 Section X3-X3 and FIG. 11 section Y-Y, each illustrate a cross-sectional view of the semiconductor structure along sections X1-X1, X2-X2, X3-X3 and Y-Y, respectively, and illustrates formation of a source drain vertical trench, according to an exemplary embodiment.

Referring now to FIG. 11 Sections X1-X1, X2-X2, X3-X3 and Y-Y, the structure 100 is shown according to an exemplary embodiment. FIG. 11 Sections X1-X1, X2-X2 and X3-X3 are each a cross-sectional view of the structure 100 along section lines X1-X1, X2-X2 and X3-X3, respectively and are parallel to each other. FIG. 11 Section Y-Y is a cross-sectional view of the structure 100 along section line Y-Y and is perpendicular to section lines X1-X1, X2-X2 and X3-X3.

As shown in FIG. 11 Sections X1-X1 and Y-Y, a portion of the etch stop liner 50 and a portion of the source drain epitaxy 46 may be removed between sacrificial gates 30, forming a source drain vertical trench 54.

The source drain vertical trench 54 may be formed between each sacrificial spacer 52 surrounding each sacrificial gate 30, gate hardmask 32 and gate spacer 38 by an anisotropic etching technique, such as, for example, reactive ion etching (RIE), and stopping at an upper surface of the bottom dielectric isolation 36. Removal of the portion of the etch stop liner 50 and the portion of the source drain epitaxy 46 is selective to the sacrificial spacer 52, and the bottom dielectric isolation 36. A vertical side surface of the bottom dielectric isolation 36 may be exposed between sacrificial gates, as shown in Section X1-X1 and Section Y-Y. An upper surface of the STI 22 may be exposed between sacrificial gates 30, as shown in Section X1-X1.

The source drain vertical trench 54 may be referred to as a self-aligned source drain epitaxy cut as the sacrificial spacer 52 helps to protect the sacrificial gate 30, the gate hardmask 32, the gate spacer 38, the channels layers 16, the sacrificial suspension layers 14 and the inner spacers 42.

In an alternate embodiment, the source drain vertical trench 54 may have a lower surface of the source drain epitaxy 46, where a portion of the source drain epitaxy 46 remains in the source drain vertical trench 54 above the bottom dielectric isolation 36.

Figure 12:
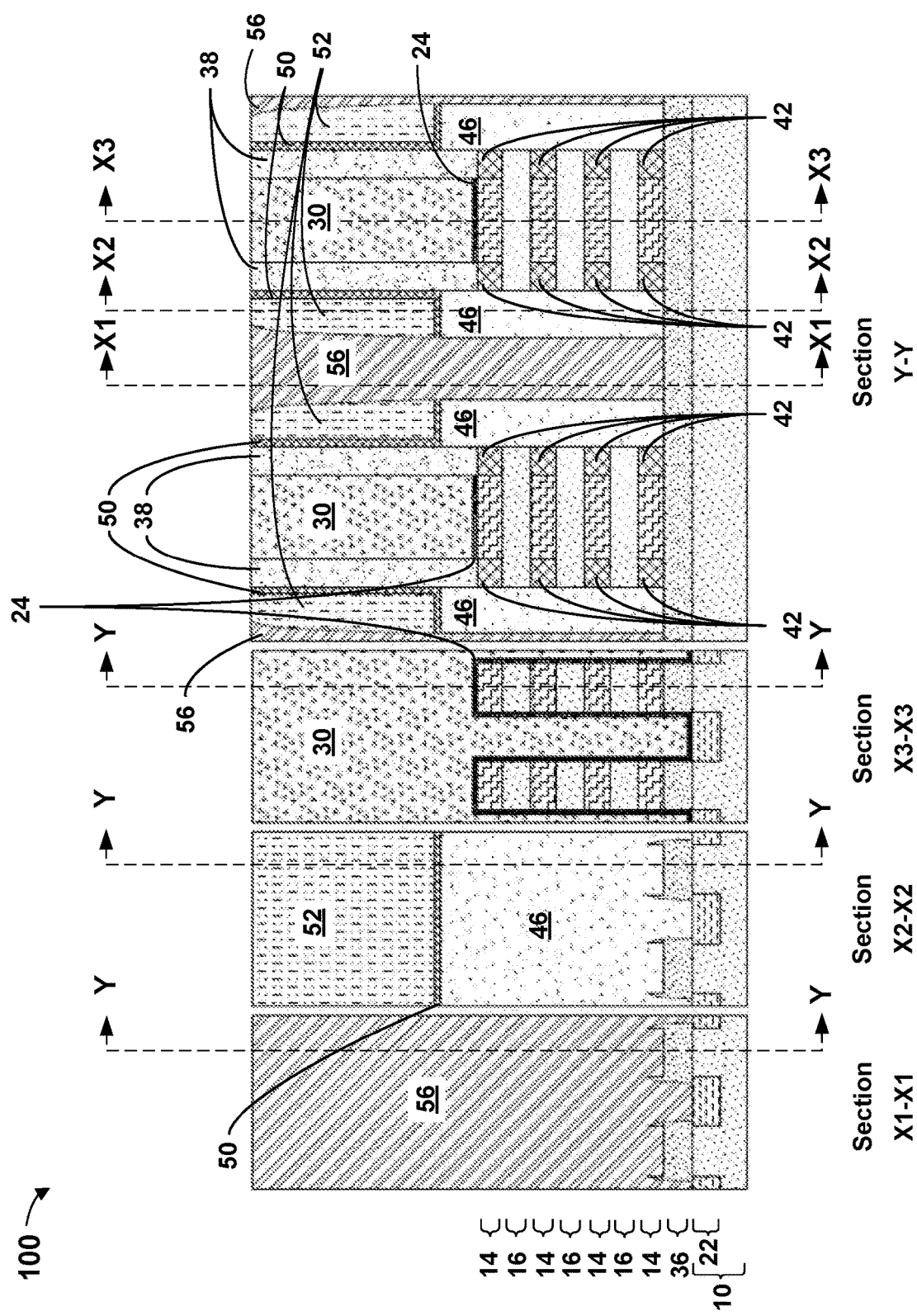
FIG. 12 Section X1-X1, FIG. 12 Section X2-X2, FIG. 12 Section X3-X3 and FIG. 12 section Y-Y, each illustrate a cross-sectional view of the semiconductor structure along sections X1-X1, X2-X2, X3-X3 and Y-Y, respectively, and illustrates deposition of a stressor material layer, according to an exemplary embodiment.

Referring now to FIG. 12 Sections X1-X1, X2-X2, X3-X3 and Y-Y, the structure 100 is shown according to an exemplary embodiment. FIG. 12 Sections X1-X1, X2-X2 and X3-X3 are each a cross-sectional view of the structure 100 along section lines X1-X1, X2-X2 and X3-X3, respectively and are parallel to each other. FIG. 12 Section Y-Y is a cross-sectional view of the structure 100 along section line Y-Y and is perpendicular to section lines X1-X1, X2-X2 and X3-X3.

As shown in FIG. 12 Sections X1-X1, X3-X3 and Y-Y, a stressor material layer 56 may be deposited and the gate hardmask 32 may be removed.

The stressor material layer 56 may be formed in the source drain vertical trench 54, between the source drain epitaxy 46 and the sacrificial spacer 52 surrounding each sacrificial gate 30, the gate hardmask 32, the gate spacer 38, the channels 16, the sacrificial suspension layers 14 and the inner spacers 42. A lower surface of the stressor material layer 56 may cover portions of upper surfaces and side surfaces of the bottom dielectric isolation 36, as shown in Section X1-X1 and Section Y-Y. In the alternate embodiment described above in the description of FIG. 11, the lower surface of the stressor material layer 56 may cover portions of the source drain epitaxy 46 over the bottom dielectric isolation 36.

The stressor material layer 56 may share a vertical surface with the source drain epitaxy 46, the etch stop liner 50 and the sacrificial spacer 52. The stressor material layer 56 may be conformally deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. The stressor material layer 56 may have either compressive or tensile properties depending on a deposition method and deposition conditions such as temperature, and other conditions.

In an embodiment, for an n-FET, the stressor material layer 56 may be formed to have tensile properties. In an embodiment, for a p-FET, the stressor material layer 56 may be formed to have compressive properties.

In an embodiment, the structure 100 may be exposed to a spike anneal, a high temperature anneal, a laser spike anneal, or another type of an anneal, to help re-crystalize the stressor material layer 56. The stressor material layer 56 becomes a crystallized stressor material layer 56 with enhanced tensile or compressive properties.

In an embodiment, the annealing technique may include subjecting the structure 100 to an elevated temperature, ranging from approximately 400° C. to approximately 800° C., for approximately 1 millisecond to approximately 5 seconds. In another embodiment, a high-temperature rapid thermal anneal (RTA) technique may be used.

After forming the stressor material layer 56, the structure 100 may be subject to a chemical mechanical polishing (CMP) technique to remove excess material, including the SAC 62, and polish upper surfaces of the structure 100 until horizontal upper surfaces are coplanar for the stressor material layer 56, the sacrificial spacer 52, the sacrificial gate 30, the gate spacer 38 and the etch stop liner 50.

As a result of forming the stressor material layer 56 between portions of the source drain epitaxy 46, stress will be generated. In an embodiment of an N-PET device, a tensile stress is generated on the channel layers 16 by the stressor material layer 56 through the source drain epitaxy 46. After annealing, the stressor material layer 56 may further contract and pull on the source drain epitaxy 46 to put the silicon channels 16 into increased tension.

Stress generated in the channel region helps to improve carrier mobility and device performance. Strain engineering allows local modification of band structure in the channel, affecting the effective mass of the carriers and hence the carrier mobility during transport in the channel region.

In an embodiment of a p-FET device, a compressive stress is generated on the channel layers 16 by the stressor material layer 56 though the source drain epitaxy 46. After annealing, the stressor material layer 56 may and further expand and push on the source drain epitaxy 46 to put the silicon channel layers into increased compression.

Figure 13:
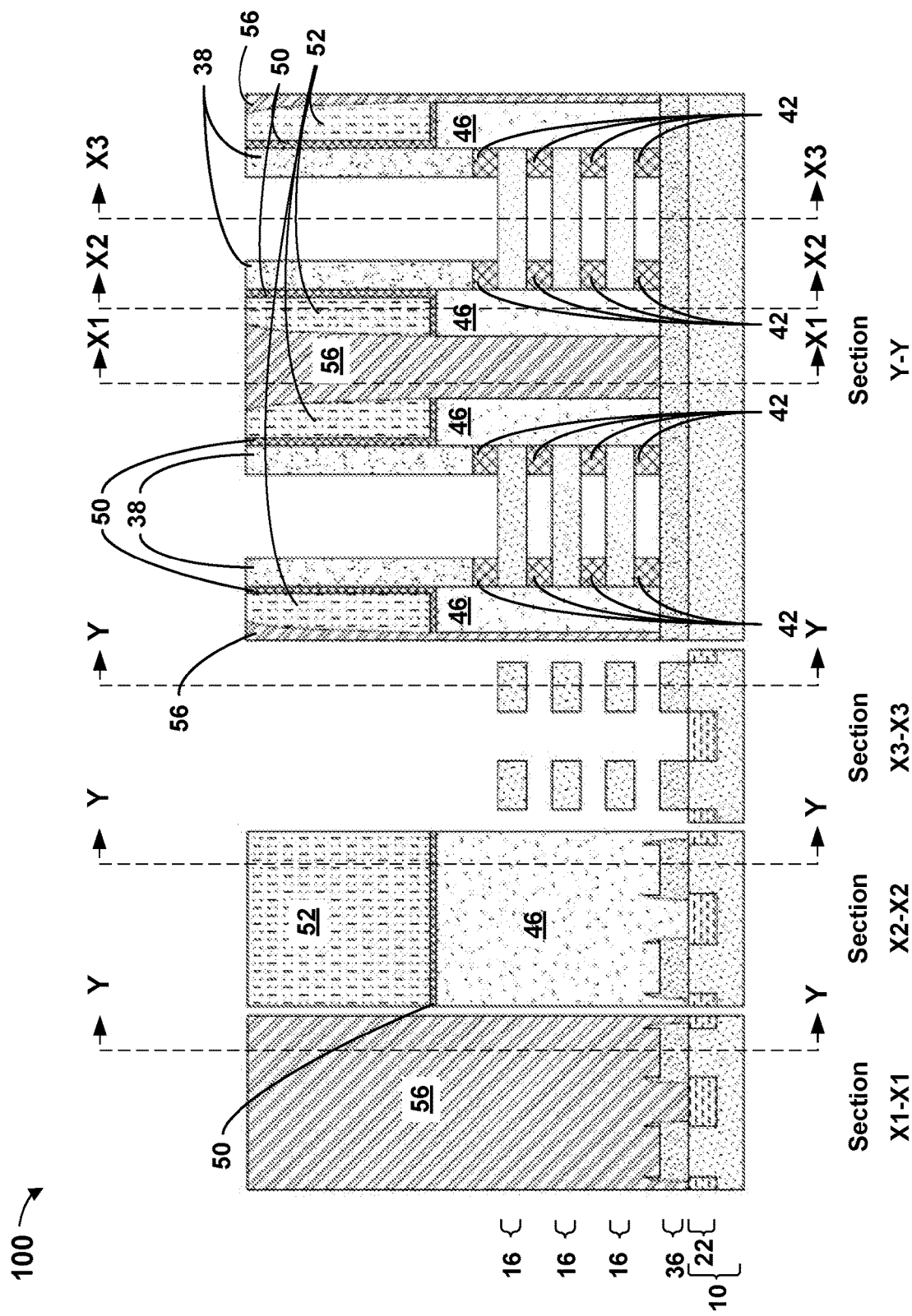
FIG. 13 Section X1-X1, FIG. 13 Section X2-X2, FIG. 13 Section X3-X3 and FIG. 13 section Y-Y, each illustrate a cross-sectional view of the semiconductor structure along sections X1-X1, X2-X2, X3-X3 and Y-Y, respectively, and illustrates removal of the sacrificial gate and removal of the sacrificial suspension layers.

Referring now to FIG. 13 Sections X1-X1, X2-X2, X3-X3 and Y-Y, the structure 100 is shown according to an exemplary embodiment. FIG. 13 Sections X1-X1, X2-X2 and X3-X3 are each a cross-sectional view of the structure 100 along section lines X1-X1, X2-X2 and X3-X3, respectively and are parallel to each other. FIG. 13 Section Y-Y is a cross-sectional view of the structure 100 along section line Y-Y and is perpendicular to section lines X1-X1, X2-X2 and X3-X3.

As shown in FIG. 13 Sections X3-X3 and Y-Y, the sacrificial gate 30 may be removed, the gate sacrificial dielectric 24 may be removed and the sacrificial suspension layers 14 may be removed.

The sacrificial gate 30 and the sacrificial suspension layers 14 may be removed by methods known in the art, and may be removed in one or more steps, selectively, or may be removed at the same time. For example, a dry etch process can be used, such as using vapor phased HCl dry etch. In an embodiment, an ammonia based etch, NH3, may be used for removal of the sacrificial gate 30, a hydrogen fluoride based etch such as HF may be used to remove the gate sacrificial dielectric 24 and a hydrogen chloride, HCl, based etch may be used to remove the sacrificial suspension layers 14. The sacrificial gate 30, the gate sacrificial dielectric 24 and the sacrificial suspension layers 14 may be removed selective to the gate spacers 38, the inner spacers 42, the channel layers 16, the bottom dielectric isolation 36, the source drain epitaxy 46, the sacrificial spacer 52, the stressor material layer 56 and the etch stop liner 50.

Removal of the sacrificial gate 30, the gate sacrificial dielectric 24 and the sacrificial suspension layers 14 may amplify stress or compression of the stressor material layer 56 through the source drain epitaxy 46 on the channel layers 16. By removing the sacrificial gates 30 and sacrificial suspensions layers 14, the material directly in contact with the channels layers 16 that were anchoring them in place are removed. Removal of these materials directly in contact the crystal lattice of the channels layers 16 allows the channel layers 16 to further expand or compress.

As illustrated in FIG. 13 Section X3-X3, the remaining channel layers 16 of the nanosheet stack are shown suspended and are supported on both ends by the source drain epitaxy 46.

Figure 14:
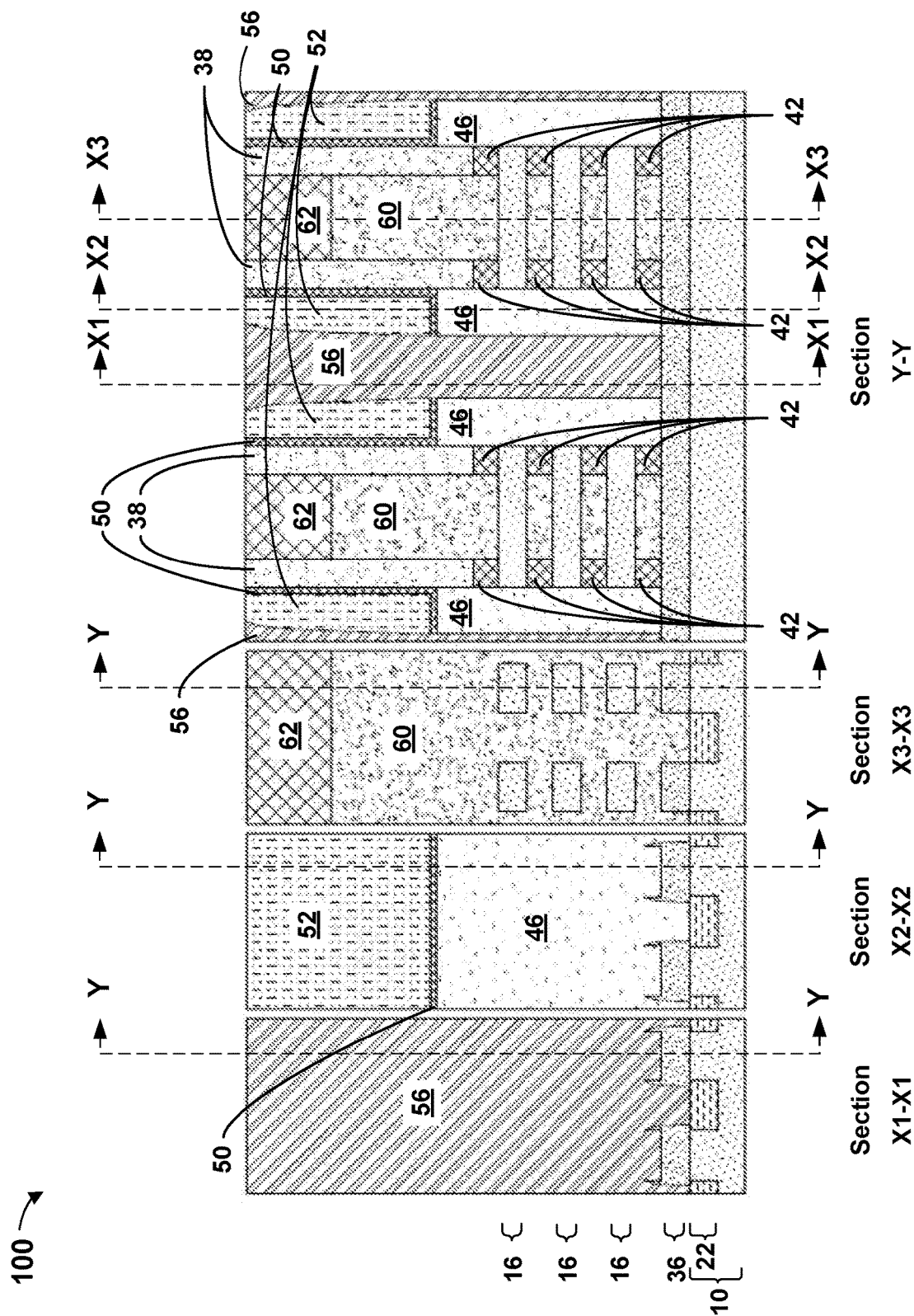
FIG. 14 Section X1-X1, FIG. 14 Section X2-X2, FIG. 14 Section X3-X3 and FIG. 14 section Y-Y, each illustrate a cross-sectional view of the semiconductor structure along sections X1-X1, X2-X2, X3-X3 and Y-Y, respectively, and illustrates formation of a gate stack and a self-aligned contact.

Referring now to FIG. 14 Sections X1-X1, X2-X2, X3-X3 and Y-Y, the structure 100 is shown according to an exemplary embodiment. FIG. 14 Sections X1-X1, X2-X2 and X3-X3 are each a cross-sectional view of the structure 100 along section lines X1-X1, X2-X2 and X3-X3, respectively and are parallel to each other. FIG. 14 Section Y-Y is a cross-sectional view of the structure 100 along section line Y-Y and is perpendicular to section lines X1-X1, X2-X2 and X3-X3.

As shown in FIG. 14 Sections X3-X3 and Y-Y, a gate stack 60 and a self-aligned contact, (hereinafter "SAC") 62 may be formed.

The gate stack 60 may be conformally formed on the structure 100, according to an exemplary embodiment. The gate stack 60 is formed in each cavity of the nanosheet stack and surrounding suspended portions of the channel layers 16. The gate stack 60 may be wrapped around each channel layer 16.

The gate stack 60 forms a layer surrounding exposed portions of the nanosheet stacks. The gate stack 60 may cover an exposed portion of the STI 22, surround exposed portions of the bottom dielectric isolation 36, exposed surfaces between the inner spacers 42, exposed portions surrounding the channel layers 16 and exposed surfaces between the gate spacers 38 over the nanosheet stack. The gate stack 60 may fill a remainder of openings where the sacrificial suspension layers 14 were removed. The gate stack 60 may fill an opening where the sacrificial gate 30 was removed between gate spacers 38 over the nanosheet stack.

In an embodiment, a high-k liner, not shown, may be conformally formed before formation of the gate stack 60, and the gate stack 60 formed on the high-k liner. The high-k liner, not shown, may cover an exposed portion of the STI 22, surround exposed portions of the bottom dielectric isolation 36, exposed surfaces between the inner spacers 42 and exposed surfaces between the gate spacers 38 over the nanosheet stack. The high-k liner, not shown, may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the high-k liner, not shown, may include one or more layers. The high-k liner, not shown, may include materials such as HfO2, ZrO2, Al2O3, La2O3, TiO2, SrTiO3, LaAlO3, Y2O3, HfOxNy, ZrOxNy, La2OxNy, Al2OxNy, TiOxNy, SrTiOxNy, LaAlOxNy, Y2OxNy, SiON, SiNx, a silicate thereof, and an alloy thereof. The high-k liner, not shown, may be referred to as a gate dielectric, and may be 2 nm thick. The high-k liner, not shown, may serve as the gate oxide for future gate formation.

The gate stack 60 may be deposited using typical deposition techniques, for example, atomic layer deposition (ALD), molecular layer deposition (MLD), and chemical vapor deposition (CVD). The material chosen for the gate stack 60, and the high-k liner, not shown, may be selected based on a desired threshold voltage, in combination with other materials and properties as described above, for the nanosheet stack, where the gate stack 60 surrounds the channel layers 16, and whether the device is a p-FET or n-FET. In an embodiment, the work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the gate stack 60 may include one or more layers to achieve desired device characteristics.

The gate stack 60 may cover a portion of an opening where the sacrificial gate 30 was removed, between the gate spacers 38. A remainder of the opening where the sacrificial gate 30 was removed may be filled with the SAC 62. The SAC 62 may be referred to as a SAC, self-aligned metal gate contact, 62.

The SAC 62 may include materials such as, for example, silicon nitride, SiN). The SAC 62 may be formed in accordance with known techniques.

After forming the gate stack 60 and the SAC 62, a chemical mechanical polishing (CMP) technique may be used to remove excess material and polish upper surfaces of the structure 100 such that upper horizontal surfaces of the SAC 62, the gate spacers 38, the etch stop liner 50, the sacrificial spacer 52 and the stressor material layer 56 are coplanar.

The gate stack 60 and the SAC 62 may anchor the stress or the compression of the stressor material layer 56 through the source drain epitaxy 46 on the channel layers 16, holding atoms in position to hold the stress or compression of a crystal lattice of the channel layers 16. The formation of the gate stack 60 over the compressive or tensile channel layers 16 helps anchor the stress for subsequent process steps.

Figure 15:
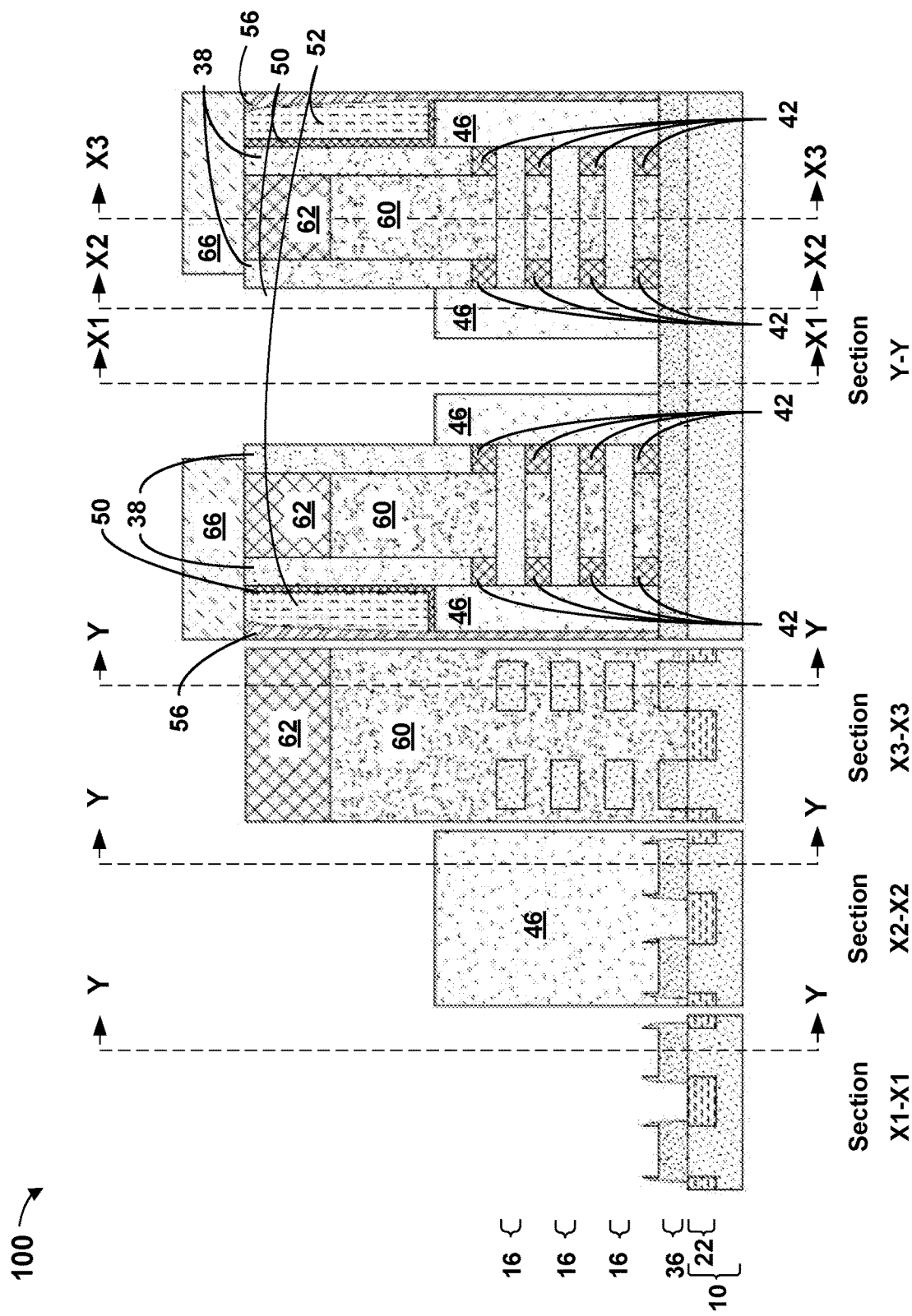
FIG. 15 Section X1-X1, FIG. 15 Section X2-X2, FIG. 15 Section X3-X3 and FIG. 15 section Y-Y, each illustrate a cross-sectional view of the semiconductor structure along sections X1-X1, X2-X2, X3-X3 and Y-Y, respectively, and illustrates formation of a first organic planarization layer, partial removal of the stressor material layer, partial removal of the sacrificial spacer and partial removal of the etch stop liner.

Referring now to FIG. 15 Sections X1-X1, X2-X2, X3-X3 and Y-Y, the structure 100 is shown according to an exemplary embodiment. FIG. 15 Sections X1-X1, X2-X2 and X3-X3 are each a cross-sectional view of the structure 100 along section lines X1-X1, X2-X2 and X3-X3, respectively and are parallel to each other. FIG. 15 Section Y-Y is a cross-sectional view of the structure 100 along section line Y-Y and is perpendicular to section lines X1-X1, X2-X2 and X3-X3.

As shown in FIG. 15 Sections X1-X1, X2-X2, X3-X3 and Y-Y, a first organic planarization layer (hereinafter "first OPL") 66 may be formed. Partial removal of the stressor material layer 56, the sacrificial spacer 52 and the etch stop liner 50 may be performed.

The first OPL 66 may be deposited and patterned on the structure 100. The first OPL 66 may protect the gate stack 60 and provide an opening between every other gate stack 60. The first OPL 66 may protect the stressor material layer 56, the sacrificial spacer 52 and the etch stop liner 50 between the remaining every other gate stack 60. The first OPL 66 may be formed by a blanket deposition using typical deposition techniques, for example spin-on coating. The first OPL 66 can be a self-planarizing organic material that includes carbon, hydrogen, oxygen, and optionally nitrogen, fluorine, and silicon. The first OPL 66 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

The first OPL 66 may be referred to as a first trench contact patterning mask. The first OPL 66 may provide access for subsequent patterning between alternate gate stacks 60, such that each gate stack 60 may have a first side with the stressor material layer 56, the sacrificial spacer 52 and the etch stop liner 50 protected by the first OPL 66. A second side of each gate stack 60 may have an opening in the first OPL 66, where the stressor material layer 56, the sacrificial spacer 52 and the etch stop liner 50 are exposed.

A combination of etching techniques may be used to removing the portions of the stressor material layer 56, the portions of the sacrificial spacer 52 and the portions of the etch stop liner 50, between alternate gate stacks 60, and may be done in multiple steps. An upper surface and a side surface of the source drain epitaxy 46 may be exposed, and an upper surface and side surface of the bottom dielectric isolation 36 may be exposed. Side surfaces of the gate spacer 38 may be exposed.

The first OPL 66 and subsequent partial removal of the stressor material layer 56, the sacrificial spacer 52 and the etch stop liner 50 between every other gate stack 60 may allow partial relaxation of the channel layers 16, while keeping strain on alternate sides of each gate stack 60. The formation of the gate stack 60 over the compressive or tensile channel layers 16 helps anchor and preserve the stress during this step.

Figure 16:
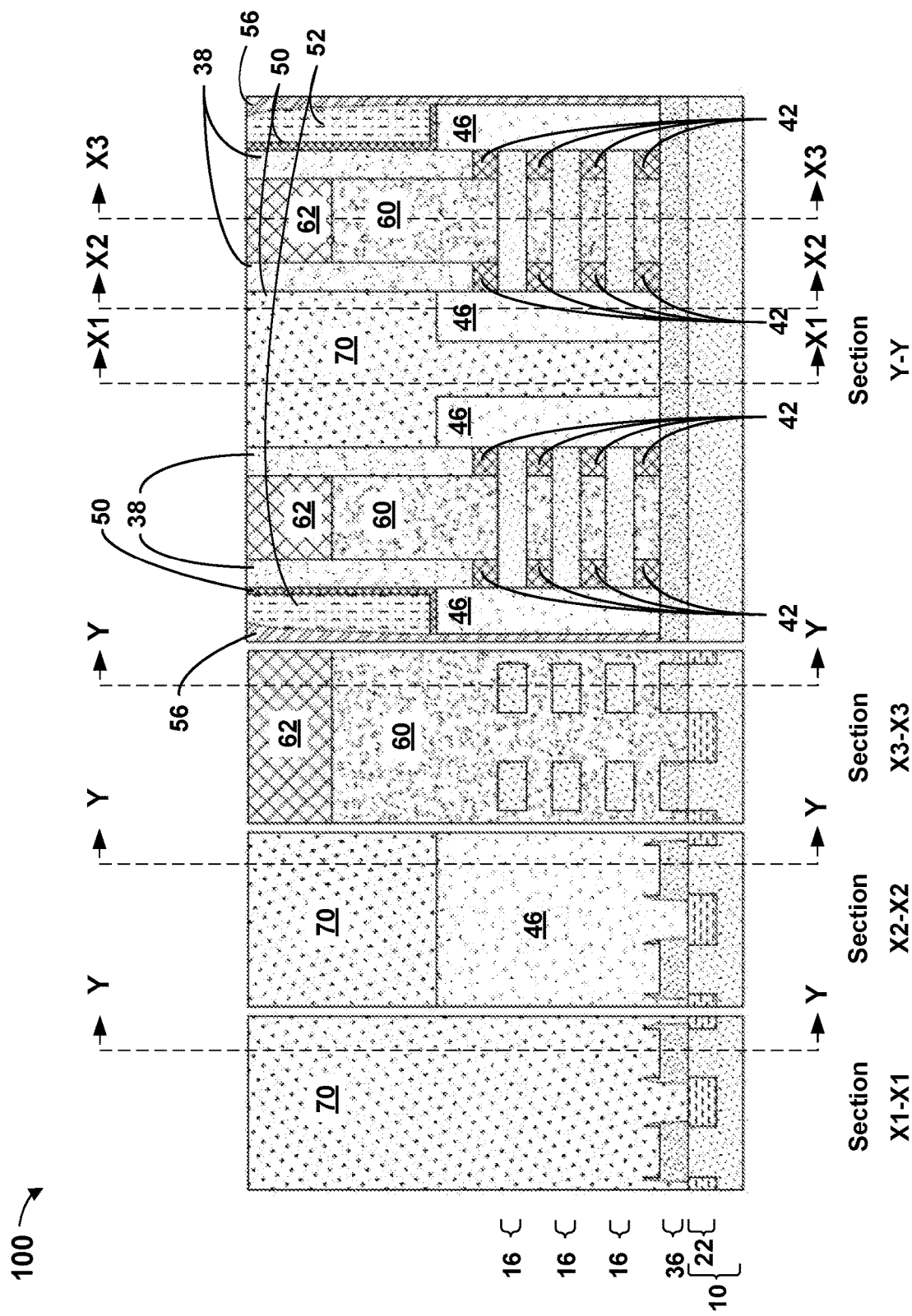
FIG. 16 Section X1-X1, FIG. 16 Section X2-X2, FIG. 16 Section X3-X3 and FIG. 16 section Y-Y, each illustrate a cross-sectional view of the semiconductor structure along sections X1-X1, X2-X2, X3-X3 and Y-Y, respectively, and illustrates formation of a first trench contact.

Referring now to FIG. 16 Sections X1-X1, X2-X2, X3-X3 and Y-Y, the structure 100 is shown according to an exemplary embodiment. FIG. 16 Sections X1-X1, X2-X2 and X3-X3 are each a cross-sectional view of the structure 100 along section lines X1-X1, X2-X2 and X3-X3, respectively and are parallel to each other. FIG. 16 Section Y-Y is a cross-sectional view of the structure 100 along section line Y-Y and is perpendicular to section lines X1-X1, X2-X2 and X3-X3.

As shown in FIG. 16 Sections X1-X1, X2-X2 and Y-Y, a first trench contact 70 may be formed.

The first trench contact 70 may be conformally formed on the structure 100, according to an exemplary embodiment. The first trench contact 70 may cover an exposed portion of the STI 22, exposed surfaces between the source drain epitaxy 46 and exposed surfaces between the gate spacers 38, all between every other gate stack 60 as described in the figures of FIG. 15 above.

The first trench contact 70 may be deposited using typical deposition techniques, for example, atomic layer deposition (ALD), molecular layer deposition (MLD), and chemical vapor deposition (CVD). The material chosen for the first trench contact 70, may be selected based on whether the device is a p-FET or n-FET. In an embodiment, the material used for the first trench contact 70 for a p-FET device may include a metal nitride, for example, titanium nitride or tantalum nitride, titanium carbide titanium aluminum carbide, or other suitable materials known in the art. In an embodiment, the material chosen for the first trench contact 70 for n-FET device may include, for example, titanium aluminum carbide or other suitable materials known in the art. In an embodiment, the material may include one or more layers to achieve desired device characteristics.

After forming the first trench contact 70, a chemical mechanical polishing (CMP) technique may be used to remove excess material and polish upper surfaces of the structure 100 such that upper horizontal surfaces of the first trench contact 70, the gate spacer 38, the SAC 62, the etch stop liner 50 and the stressor material layer 56 are coplanar.

The first trench contact 70 may help to keep stress, either tension or compression, on the channel layers 16 through the source drain epitaxy 46. The first trench contact 70 may have a "T" shape between every other gate stack 60.

The first trench contact 70 may have a "T" shape, where a top portion is wider between gate spacers 38 with a horizontal portion on a horizontal portion of the source drain epitaxy 46, and a lower portion of the first trench contact 70 is more narrow between source drain epitaxys 46.

In the alternate embodiment, as described above, the first trench contact 70 may have a lower horizontal surface covering a portion of the source drain epitaxy 46, where the portion of the source drain epitaxy 46 remains above the bottom dielectric isolation 36.

Figure 17:
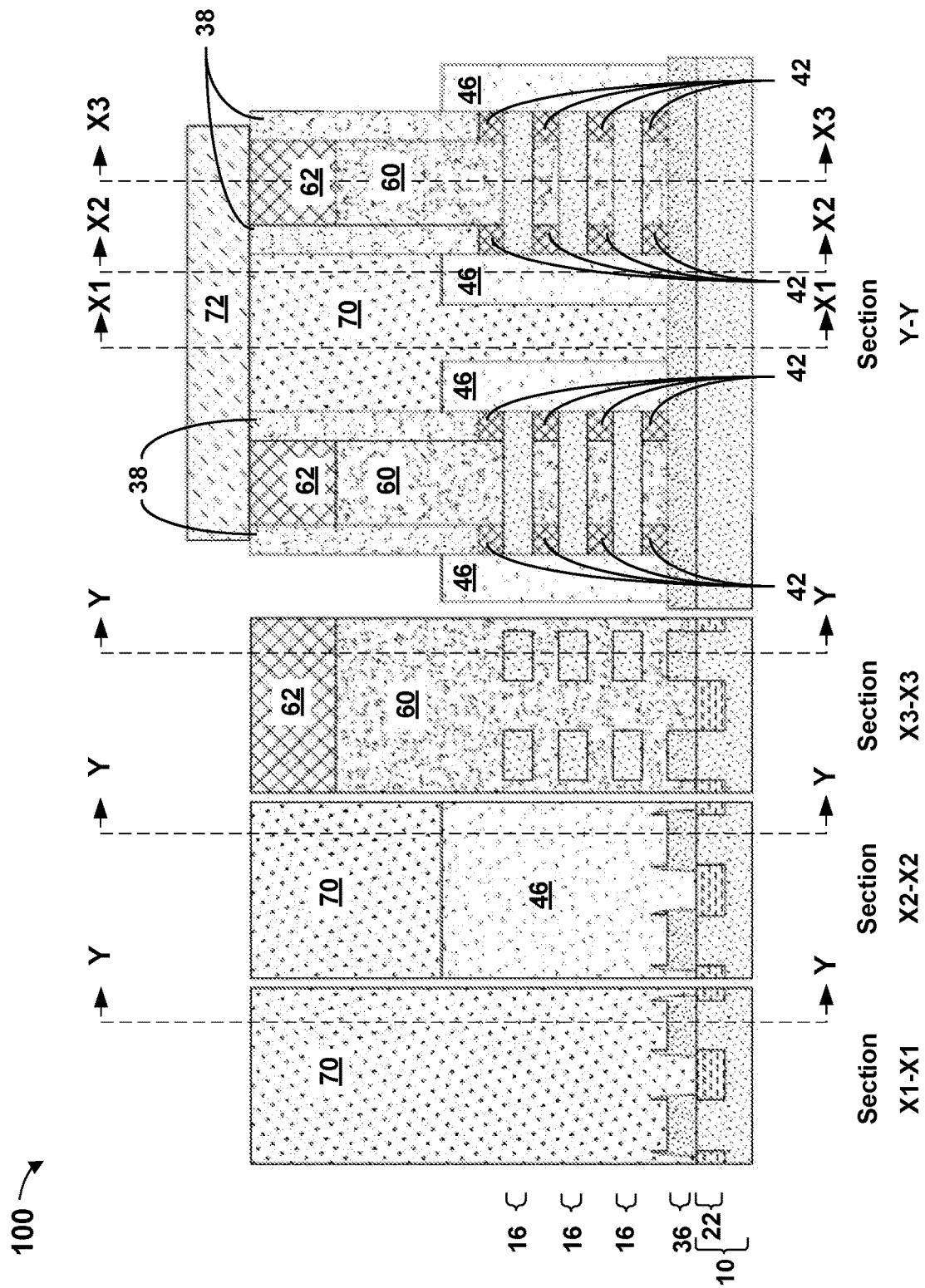
FIG. 17 Section X1-X1, FIG. 17 Section X2-X2, FIG. 17 Section X3-X3 and FIG. 17 section Y-Y, each illustrate a cross-sectional view of the semiconductor structure along sections X1-X1, X2-X2, X3-X3 and Y-Y, respectively, and formation of a second organic planarization layer, removal of remaining portions of the stressor material layer, remaining portions of the sacrificial spacer and remaining portions of the etch stop liner.

Referring now to FIG. 17 Sections X1-X1, X2-X2, X3-X3 and Y-Y, the structure 100 is shown according to an exemplary embodiment. FIG. 17 Sections X1-X1, X2-X2 and X3-X3 are each a cross-sectional view of the structure 100 along section lines X1-X1, X2-X2 and X3-X3, respectively and are parallel to each other. FIG. 17 Section Y-Y is a cross-sectional view of the structure 100 along section line Y-Y and is perpendicular to section lines X1-X1, X2-X2 and X3-X3.

As shown in FIG. 17 Sections X3-X3 and Y-Y, a second organic planarization layer (hereinafter "second OPL") 72 may be formed. Removal of remaining portions of the stressor material layer 56, remaining portions of the sacrificial spacer 52 and remaining portions the etch stop liner 50 may be performed.

The second OPL 72 may be deposited and patterned on the structure 100. The second OPL 72 may protect the gate stack 60 and provide an opening between every other gate stack 60. The second OPL 72 may be formed and of a material as described above in regards to the first OPL 66.

The second OPL 72 may be referred to as a second trench contact patterning mask. The second OPL 72 may provide access for subsequent patterning between alternate gate stacks 60, such that each gate stack 60 may have the second side protected by the second OPL 72 and the first side with an opening in the second OPL 72.

A combination of etching techniques may be used to removing the remaining portions of the stressor material layer 56, the remaining portions of the sacrificial spacer 52 and the remaining portions of the etch stop liner 50, between a alternate gate stacks 60, and may be done in multiple steps. An upper surface and a side surface of the source drain epitaxy 46 may be exposed, and an upper surface and side surface of the bottom dielectric isolation 36 may be exposed. Side surfaces of the gate spacer 38 may be exposed.

The second OPL 72 and subsequent removal of the remaining portions of the stressor material layer 56, the remaining portions of the sacrificial spacer 52 and the remaining portions of the etch stop liner 50 between every other gate stack 60 may allow partial relaxation of the channel layers 16, while keeping strain on alternate sides of each gate stack 60. The formation of the gate stack 60 over the compressive or tensile channel layers 16 helps anchor and preserve the stress during this step.

Figure 18:
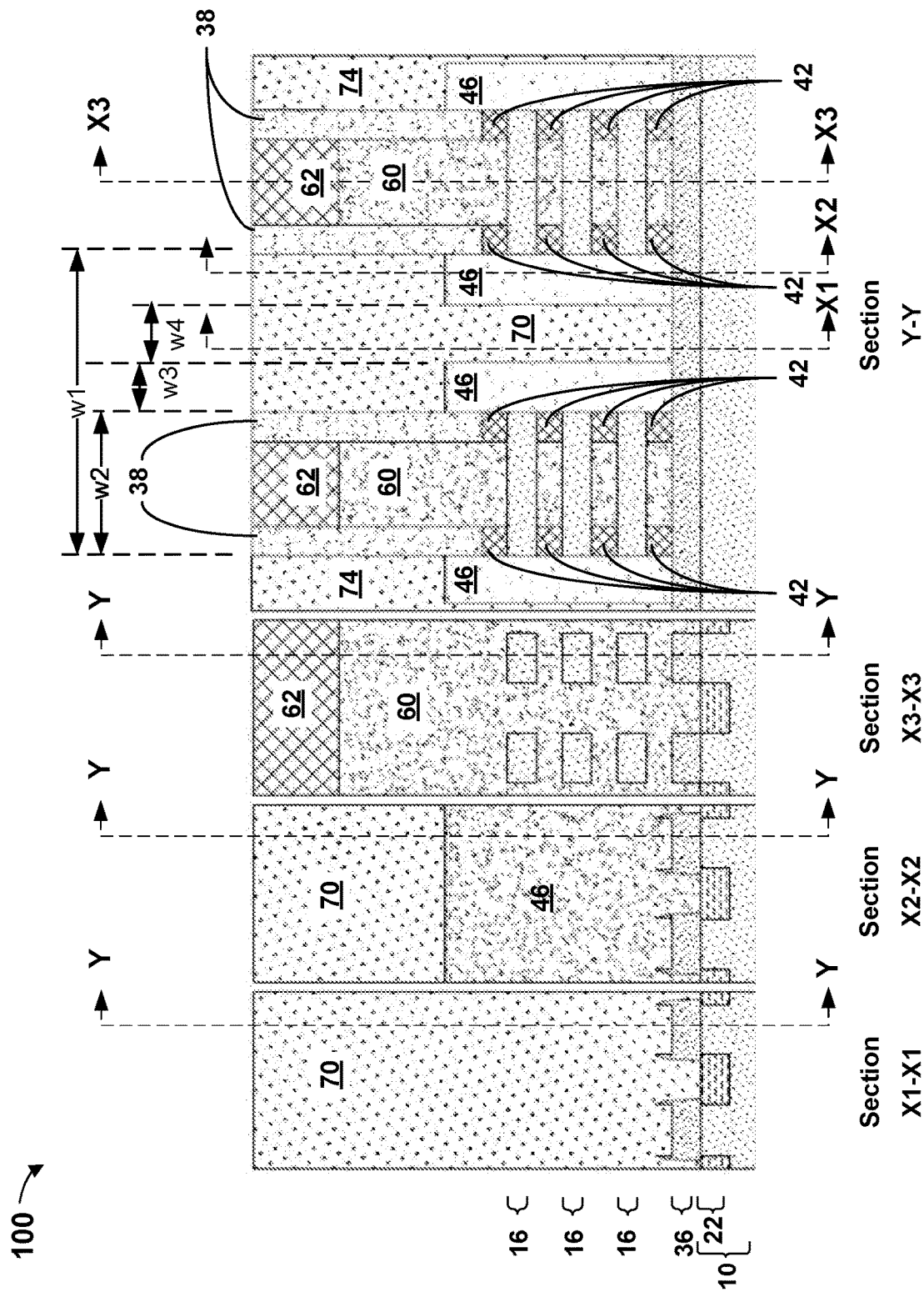
FIG. 18 Section X1-X1, FIG. 18 Section X2-X2, FIG. 18 Section X3-X3 and FIG. 18 section Y-Y, each illustrate a cross-sectional view of the semiconductor structure along sections X1-X1, X2-X2, X3-X3 and Y-Y, respectively, and formation of a second trench contact.

Referring now to FIG. 18 Sections X1-X1, X2-X2, X3-X3 and Y-Y, the structure 100 is shown according to an exemplary embodiment. FIG. 18 Sections X1-X1, X2-X2 and X3-X3 are each a cross-sectional view of the structure 100 along section lines X1-X1, X2-X2 and X3-X3, respectively and are parallel to each other. FIG. 18 Section Y-Y is a cross-sectional view of the structure 100 along section line Y-Y and is perpendicular to section lines X1-X1, X2-X2 and X3-X3.

As shown in FIG. 18 Sections X1-X1, X2-X2 and Y-Y, a second trench contact 74 may be formed.

The second trench contact 74 may be conformally formed on the structure 100, according to an exemplary embodiment. The second trench contact 74 may cover an exposed portion of the STI 22, exposed surfaces between the source drain epitaxy 46 and exposed surfaces between the gate spacers 38, all between every other gate stack 60 as described in the figures of FIG. 17 above.

The second trench contact 74 may be deposited and of a material as described above in regards to the first trench contact 70.

After forming the second trench contact 74, a chemical mechanical polishing (CMP) technique may be used to remove excess material and polish upper surfaces of the structure 100 such that upper horizontal surfaces of the second trench contact 74, the first trench contact 70, the gate spacer 38, the SAC 62 are coplanar.

The second trench contact 74 may help to keep stress on the channel layers 16 through the source drain epitaxy 46. The second trench contact 74 may have a "T" shape between every other gate stack 60.

Formation of the first trench contact 70 and the second trench contact 74 sequentially may help to reduce overall channel relaxation when the stressor material layer 56 is removed separately from each side of the nanosheet stack.

As proposed herein, a vertical portion of the source drain epitaxy 46 may be recessed between the sacrificial gates 30, and subsequently filled with the stressor material layer 56. The chosen stressor material layer 56 provides the desired strain in the channel layers 16, whether compressive for p-FET or tensile for n-FET, through the source drain epitaxy 46 to the semiconductor channel layers 16 of the nanosheet stack.

Stress on the channel layers 16 improves performance of the nanosheet FET by generating strain in the channel layers 16, improving carrier mobility in the channel layers 16 and thereby increasing device performance. Strain engineering allows local modification of the band structure in the channel layers 16, affecting the effective mass of the carriers and hence the carrier mobility during transport in the channel layers 16.

In the alternate embodiment, as described above, the second trench contact 74 may have a lower horizontal surface covering a portion of the source drain epitaxy 46, where the portion of the source drain epitaxy 46 remains above the bottom dielectric isolation 36 between adjacent nanosheet stacks.

In an embodiment, a width w1, from a first edge of a nanosheet stack to a first edge of another nanosheet stack may be 54 nm. In an embodiment, a width w2, between outside edges of gate spacers 38 surrounding the gate stack 60, may be 25 nm. In an embodiment, a width w3, of the source drain epitaxy 46 adjacent to the nanosheet stack may be 9 nm. In an embodiment, a width w4, of the first trench contact 70 between the source drain epitaxy 46 surrounding each nanosheet stack or gate stack 60 may be 11 nm.

Figure 19:
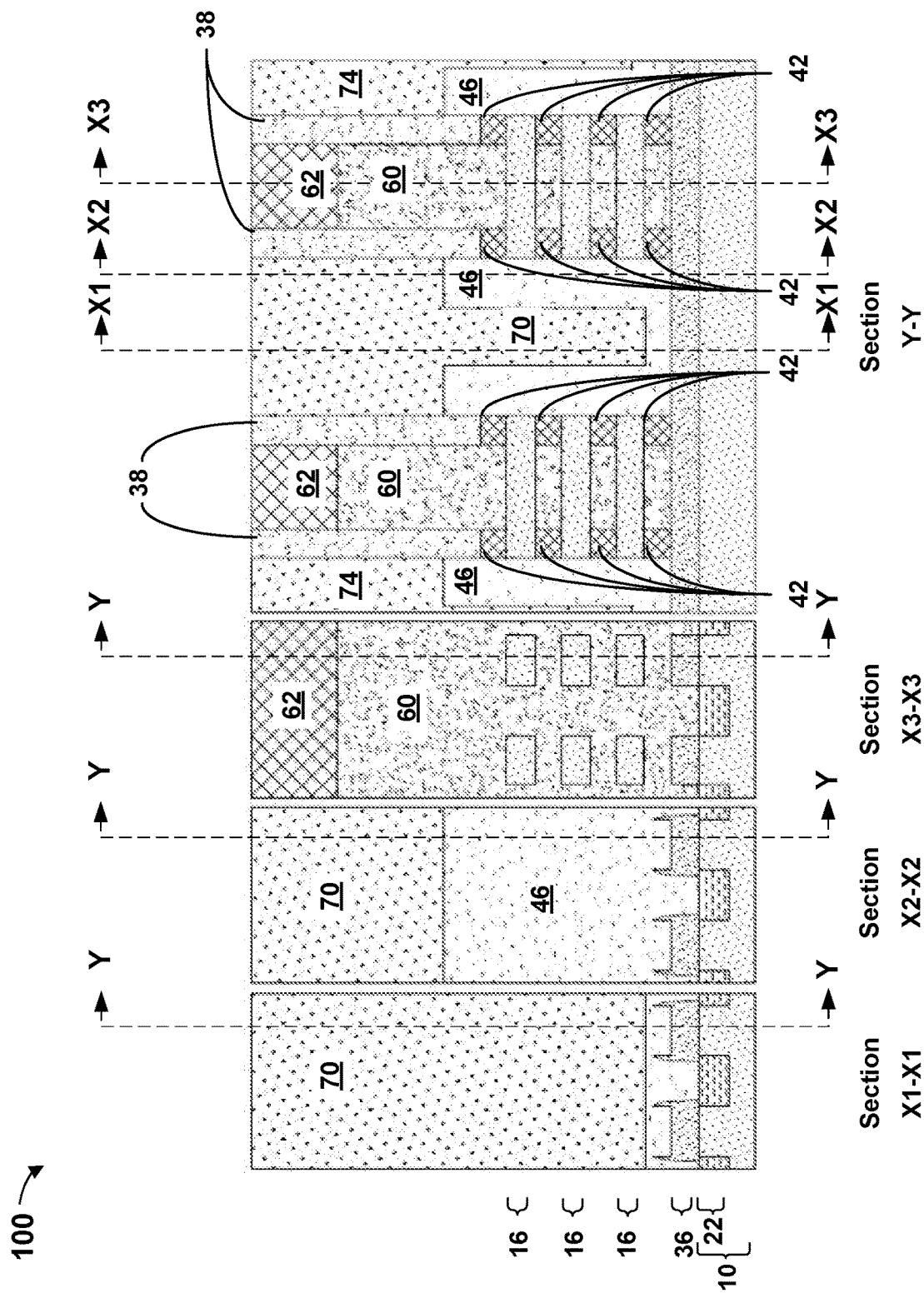
FIG. 19 Section X1-X1, FIG. 19 Section X2-X2, FIG. 19 Section X3-X3 and FIG. 19 section Y-Y, each illustrate a cross-sectional view of the semiconductor structure along sections X1-X1, X2-X2, X3-X3 and Y-Y, respectively, and an alternate embodiment where a portion of the source drain epitaxy remains between adjacent nanosheet stacks.

Referring now to FIG. 19 Sections X1-X1, X2-X2, X3-X3 and Y-Y, the structure 100 is shown according to an exemplary embodiment. FIG. 19 Sections X1-X1, X2-X2 and X3-X3 are each a cross-sectional view of the structure 100 along section lines X1-X1, X2-X2 and X3-X3, respectively and are parallel to each other. FIG. 19 Section Y-Y is a cross-sectional view of the structure 100 along section line Y-Y and is perpendicular to section lines X1-X1, X2-X2 and X3-X3.

As shown in FIG. 19 Sections X1-X1, X2-X2, X3-X3 and Y-Y, the alternate embodiment where a portion of the source drain epitaxy 46 remains between adjacent nanosheet stacks is shown. An upper surface of the source drain epitaxy 46 may be adjacent to a lower surface of the first trench contact 70 between alternate nanosheet stacks. An second upper surface of the source drain epitaxy 46 may be adjacent to a lower surface of the second trench contact 74 between the other alternate nanosheet stacks.

Figure 20:
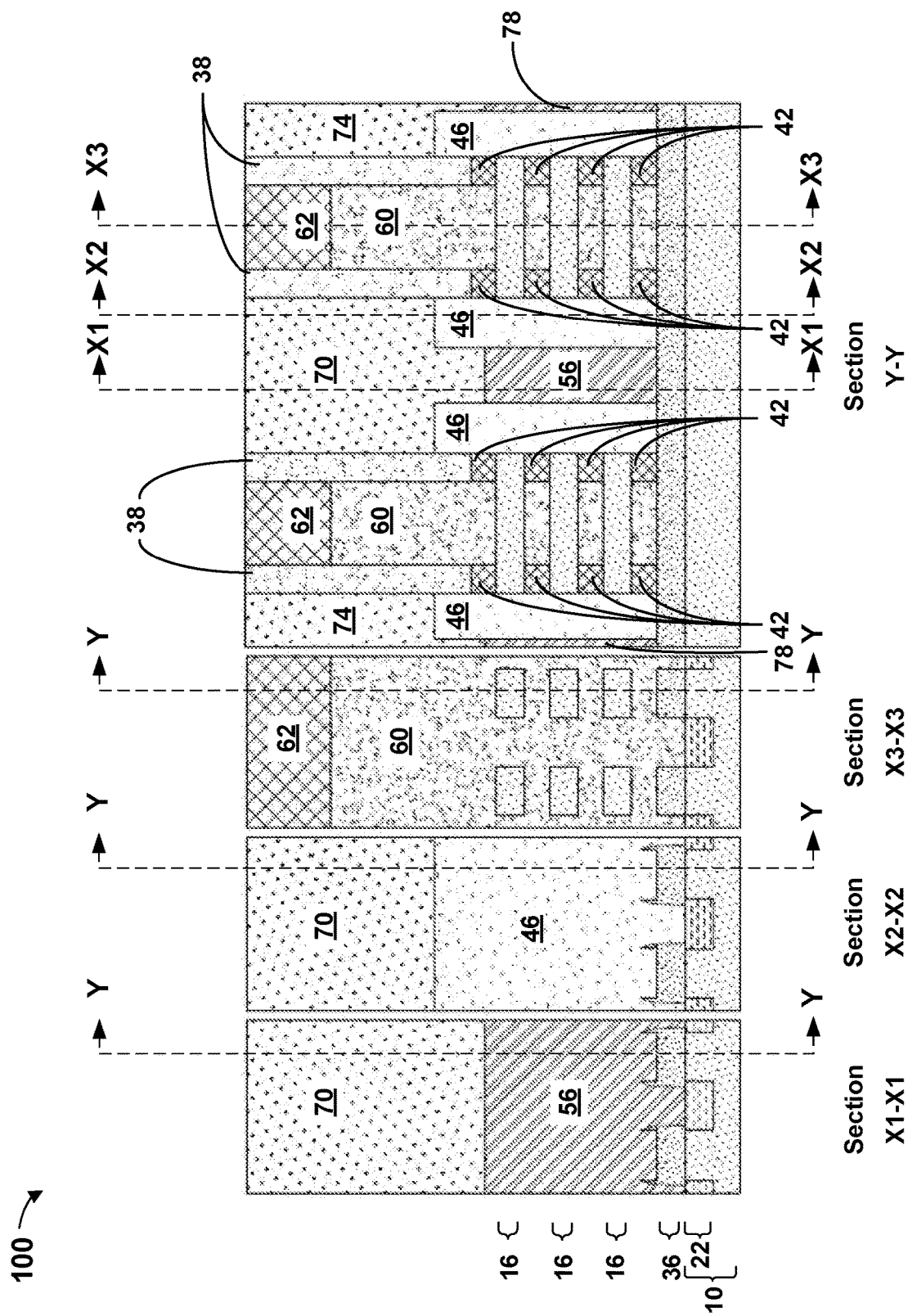
FIG. 20 Section X1-X1, FIG. 20 Section X2-X2, FIG. 20 Section X3-X3 and FIG. 20 section Y-Y, each illustrate a cross-sectional view of the semiconductor structure along sections X1-X1, X2-X2, X3-X3 and Y-Y, respectively, and an alternate embodiment where a portion of the stressor material layer remains between adjacent nanosheet stacks.

Referring now to FIG. 20 Sections X1-X1, X2-X2, X3-X3 and Y-Y, the structure 100 is shown according to an exemplary embodiment. FIG. 20 X1-X1, X2-X2 and X3-X3 are each a cross-sectional view of the structure 100 along section lines X1-X1, X2-X2 and X3-X3, respectively and are parallel to each other. FIG. 20 Section Y-Y is a cross-sectional view of the structure 100 along section line Y-Y and is perpendicular to section lines X1-X1, X2-X2 and X3-X3.

As shown in FIG. 20 Sections X1-X1, X2-X2, X3-X3 and Y-Y, an alternate embodiment is shown.

In this embodiment, a portion of the stressor material layer 56 remains in the structure 100 between adjacent source drain epitaxys 46. In this embodiment, after the first OPL 66 is deposited, when etching to remove portions of the stressor material layer 56, a remaining portion of the stressor material layer 56 remains between adjacent source drain epitaxys 46. The first trench contact 70 may then be formed on the stressor material layer 56 between adjacent source drain epitaxys 46. After the second OPL 72 is deposited, when etching to remove portions of the stressor material layer 56, a remaining portion of the stressor material layer 56 remains between adjacent source drain epitaxys 46. The second trench contact 74 may then be formed on the stressor material layer 56 between adjacent source drain epitaxys 46.

This embodiment may keep a strain on the channel layers 16 through the source drain epitaxy 46 without relaxation when the source drain epitaxys 46 are partially removed between adjacent nanosheet stacks.

An alternative version of this embodiment may include an OPL which has openings to remove material and allow formation of the first trench contact 70 and the second trench contact 74 concurrently. The remaining portion of the stressor material layer 56 keeps the strain on the channel layers 16 through the source drain epitaxy 46.

This embodiment may keep a strain on the channel layers 16 through the source drain epitaxy 46.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a first source-drain having a first sidewall opposite a second sidewall, wherein the first sidewall of the first source-drain directly contacts end surfaces of a first set of semiconductor channel layers;

a second source-drain having a first sidewall opposite a second sidewall, wherein the first sidewall of the second source-drain directly contacts end surfaces of a second set of semiconductor channel layers; and a single stressor component sandwiched between the first source-drain and the second source-drain, wherein the single stressor component directly contacts both the second sidewall of the first source-drain and the first sidewall of the second source-drain.

2. The semiconductor device according to claim 1, further comprising:

a bottom dielectric isolation layer between and physically separating the single stressor component from an underlying substrate, wherein the single stressor component directly contacts a top surface and a sidewall of the bottom dielectric isolation layer.

3. The semiconductor device according to claim 1, further comprising:

a bottom dielectric isolation layer between and physically separating the single stressor component from an underlying substrate, wherein a distance between opposite sidewalls of the bottom dielectric isolation layer is equal to a distance between opposite sidewalls of the first set of semiconductor channel layers.

4. The semiconductor device according to claim 1, further comprising:

a bottom dielectric isolation layer between and physically separating the single stressor component from an underlying substrate; and shallow trench isolation regions, wherein the bottom dielectric isolation layer is above and directly contacting top surfaces of the shallow trench isolation regions.

5. The semiconductor device according to claim 1, further comprising:

a trench contact above the first source-drain, the single stressor component, and the second source-drain, wherein a lateral width of the trench contact is equal to a combined lateral width of the first source-drain, the single stressor component, and the second source-drain.

6. The semiconductor device according to claim 1, further comprising:

a trench contact above the first source-drain, the single stressor component, and the second source-drain, wherein a first sidewall of the trench contact is flush with the end surfaces the first set of semiconductor channel layers; and wherein a second sidewall of the trench contact is flush with the end surfaces the second set of semiconductor channel layers.

7. A semiconductor device comprising:

a first source-drain having a first sidewall opposite a second sidewall, wherein the first sidewall of the first source-drain directly contacts end surfaces of a first set of semiconductor channel layers;

a single stressor component having a first sidewall opposite a second sidewall, wherein the first sidewall of the single stressor component directly contacts the second sidewall of the first source-drain; and a second source-drain having a first sidewall opposite a second sidewall, wherein the first sidewall of the second source-drain directly contacts the second sidewall of the single stressor component, and wherein the second sidewall of the second source-drain directly contacts end surfaces of a second set of semiconductor channel layers.

8. The semiconductor device according to claim 7, further comprising:

a bottom dielectric isolation layer between and physically separating the single stressor component from an underlying substrate, wherein the single stressor component directly contacts a top surface and a sidewall of the bottom dielectric isolation layer.

9. The semiconductor device according to claim 7, further comprising:

a bottom dielectric isolation layer between and physically separating the single stressor component from an underlying substrate, wherein a distance between opposite sidewalls of the bottom dielectric isolation layer is equal to a distance between opposite sidewalls of the first set of semiconductor channel layers.

10. The semiconductor device according to claim 7, further comprising:

a bottom dielectric isolation layer between and physically separating the single stressor component from an underlying substrate; and shallow trench isolation regions, wherein the bottom dielectric isolation layer is above and directly contacting top surfaces of the shallow trench isolation regions.

11. The semiconductor device according to claim 7, further comprising:

a trench contact above the first source-drain, the single stressor component, and the second source-drain, wherein a lateral width of the trench contact is equal to a combined lateral width of the first source-drain, the single stressor component, and the second source-drain.

12. The semiconductor device according to claim 7, further comprising:

a trench contact above the first source-drain, the single stressor component, and the second source-drain, wherein a first sidewall of the trench contact is flush with the end surfaces the first set of semiconductor channel layers; and wherein a second sidewall of the trench contact is flush with the end surfaces the second set of semiconductor channel layers.

13. A semiconductor device comprising:

a first source-drain epitaxy having a first sidewall opposite a second sidewall;

a second source-drain epitaxy having a first sidewall opposite a second sidewall; and a single stressor component having a first sidewall opposite a second sidewall, wherein the first sidewall of the single stressor component directly contacts the second sidewall of the first source-drain epitaxy, wherein the second sidewall of the single stressor component directly contacts the first sidewall of the second source-drain epitaxy, and wherein a topmost surface of the single stressor component is below topmost surfaces of both the first source-drain epitaxy and the second source-drain epitaxy.

14. The semiconductor device according to claim 13, further comprising:

a bottom dielectric isolation layer between and physically separating the single stressor component from an underlying substrate.

15. The semiconductor device according to claim 13, further comprising:

a bottom dielectric isolation layer between and physically separating each of the first source-drain epitaxy, the single stressor component, and the second source-drain epitaxy from an underlying substrate.

16. The semiconductor device according to claim 13, further comprising:

a bottom dielectric isolation layer between and physically separating the single stressor component from an underlying substrate, wherein the single stressor component directly contacts a top surface and a sidewall of the bottom dielectric isolation layer.

17. The semiconductor device according to claim 13, further comprising:
a bottom dielectric isolation layer between and physically separating the single stressor component from an underlying substrate, wherein a distance between opposite sidewalls of the bottom dielectric isolation layer is equal to a distance between opposite sidewalls of at least one set of semiconductor channel layers.

18. The semiconductor device according to claim 13, further comprising:
a bottom dielectric isolation layer between and physically separating the single stressor component from an underlying substrate; and
shallow trench isolation regions, wherein the bottom dielectric isolation layer is above and directly contacting top surfaces of the shallow trench isolation regions.

19. The semiconductor device according to claim 13, further comprising:
a trench contact above the first source-drain epitaxy, the single stressor component, and the second source-drain epitaxy, wherein a lateral width of the trench contact is equal to a combined lateral width of the first source-drain epitaxy, the single stressor component, and the second source-drain epitaxy.

20. The semiconductor device according to claim 13, further comprising:
a trench contact above the first source-drain epitaxy, the single stressor component, and the second source-drain epitaxy, wherein a first sidewall of the trench contact is flush with the first sidewall of the first source-drain epitaxy, and wherein a second sidewall of the trench contact is flush the second sidewall of the second source-drain epitaxy.

* * * * *